United States Patent
Doynov et al.

(10) Patent No.: US 11,171,483 B2
(45) Date of Patent: Nov. 9, 2021

(54) METHOD AND SYSTEMS FOR DETECTION AND PROTECTION FROM ELECTROMAGNETIC PULSE EVENTS USING HARDWARE IMPLEMENTED ARTIFICIAL INTELLIGENCE

(71) Applicants: Plamen Doynov, Kansas City, MO (US); Timothy A. Carty, Waverly, KS (US)

(72) Inventors: Plamen Doynov, Kansas City, MO (US); Timothy A. Carty, Waverly, KS (US)

(*) Notice: Subject to any disclaimer, the term of this patent is extended or adjusted under 35 U.S.C. 154(b) by 0 days.

(21) Appl. No.: 17/148,168

(22) Filed: Jan. 13, 2021

(65) Prior Publication Data

US 2021/0305808 A1  Sep. 30, 2021

Related U.S. Application Data

(63) Continuation of application No. 16/925,600, filed on Jul. 10, 2020, now Pat. No. 10,938,204, which is a (Continued)

(51) Int. Cl.
*H02H 9/04* (2006.01)
*H02H 5/00* (2006.01)
(Continued)

(52) U.S. Cl.
CPC .............. *H02H 9/045* (2013.01); *H02H 5/00* (2013.01); *H02H 5/005* (2013.01); *H02H 9/04* (2013.01); *H02H 3/08* (2013.01); *H02H 3/105* (2013.01); *H02H 3/22* (2013.01); *H02H 9/041* (2013.01); *H02H 9/046* (2013.01)

(58) Field of Classification Search
CPC ............ H02H 9/045; H02H 5/00; H02H 9/04; H02H 3/08; H02H 9/046; H02H 3/22; H02H 3/105; H02H 9/041; G01R 9/08; G01R 31/00; G01R 29/0804;
(Continued)

(56) References Cited

U.S. PATENT DOCUMENTS 10,985,559 B2 * 4/2021 Anderson ................ H02H 3/05
2020/0271711 A1 * 8/2020 Wiedenbauer ....... G01R 31/327

* cited by examiner

*Primary Examiner* — Danny Nguyen
(74) *Attorney, Agent, or Firm* — Dale J. Ream

(57) ABSTRACT

A system and method for detecting and isolating a high-altitude electromagnetic pulse ("HEMP") along electrical lines electrically connected to a monitored infrastructure so as to protect the monitored infrastructure, the method including a phase unit receiving sensor signals from a plurality of sensors electrically connected to each of the electrical lines, respectively, upstream of and associated with the monitored infrastructure. The method includes determining if the received sensors signals associated with the respective electrical line is indicative of an E1 component of an EMP and, if so, actuating an isolation subsystem in less than 300 nanoseconds to electrically isolate the respective electrical line against propagation against the monitored infrastructure. Determining in real time if received sensor signals is indicative of the E1 component includes a hardware implemented neural network (NN) having algorithms for machine learning (ML) and artificial intelligence (AI) operable to provide instantaneous detection and classification.

20 Claims, 26 Drawing Sheets

Related U.S. Application Data continuation of application No. 16/597,427, filed on Oct. 9, 2019, now Pat. No. 10,742,025, which is a continuation of application No. 16/240,897, filed on Jan. 7, 2019, now Pat. No. 10,530,151.

(60) Provisional application No. 62/615,159, filed on Jan. 9, 2018.

(51) Int. Cl.
  *H02H 3/08* (2006.01)
  *H02H 3/10* (2006.01)
  *H02H 3/22* (2006.01)

(58) Field of Classification Search
  CPC .... G01R 31/001; G01R 31/12; G01R 31/327; G01R 31/1254; G05B 9/02
  USPC .................................................... 361/62–69
  See application file for complete search history.

$B_{N-1}B_{N-2}\cdots\cdots B_2B_1B_0$ —— 373

0 1 1 1 1 1 1 1 1 1 1 1   $S_{10}$
0 0 0 0 0 0 0 0 0 1 1 1   $S_{06}$ $S_{10} - S_6 = 011111111000_{BIN} = 2040_{DEC}$ $\Delta t = 1/F_{clock} = 200ps$ Elapsed time from $S_{10} - S_{06}$ is $3*\Delta t = 600$ ps.

The amplitude changed $2040 * \Delta V$,
where $\Delta V$ is the $V_{ref}$ step value or $\Delta V = V_{ref}\,i - V_{ref}\,i-1$.

For $S_{10} - S_{06}$ the Slew Rate is $2,040*\Delta V / 3*\Delta t$.
The amplitude of $S_{10}$ is $2047*\Delta V$.
There is also a scaling factor of the used sensor.

$S_{10}$
$S_6$ 0 0 0 0 0 0 0 0 0 0 0 0
1 0 0 0 0 0 0 0 0 0 0 0
1 1 0 0 0 0 0 0 0 0 0 0
1 1 0 0 0 0 0 0 0 0 0 0
1 1 1 0 0 0 0 0 0 0 0 0
1 1 1 0 0 0 0 0 0 0 0 0
1 1 1 1 0 0 0 0 0 0 0 0
1 1 1 1 0 0 0 0 0 0 0 0
1 1 1 1 0 0 0 0 0 1 0 0
1 1 1 1 0 0 1 1 1 0
1 1 1 1 0 1 1 1 1

$S_{10} \cdots S_5S_4S_3\,S_2S_1S_0$ Time

Table 1. Parameters of Unclassified HEMP Standards.

| Standard / Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field $E_o$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| α (1/sec) | $4 \times 10^6$ | $4 \times 10^7$ | $2.20 \times 10^9$ | $3.22 \times 10^7$ | $4 \times 10^7$ |
| β (1/sec) | $4.76 \times 10^8$ | $6 \times 10^8$ | $3.24 \times 10^7$ | $2.07 \times 10^9$ | $6 \times 10^8$ |
| Energy Density | 0.891 J/m² | 0.114 J/m² | 0.167 J/m² | 0.196 J/m² | 0.114 J/m² |

Table 2. Characteristics of the IEC E1 HEMP waveform.

| IEC E1 HEMP Waveform Properties | |
|---|---|
| Characteristic | Value |
| Waveform peak | $E_{peak} = 50{,}000 \, \text{V/m}$ |
| Spectrum peak | $E_{low\,freq} = 0.00152 \, \text{V/m/Hz}$ |
| Waveform peak power | $P_{peak} = 6.64 \times 10^6 \, \text{W/m}^2$ |
| Spectrum peak power | $P_{low\,freq} = 6.11 \times 10^{-9} \, \text{W/m}^2/\text{Hz}$ |
| Total energy | $W_{total} = 0.115 \, \text{J/m}^2$ |
| Time of peak | $t_{peak} = 4.84 \, \text{ns}$ |
| Rise time, 10% to 90% of peak | $t_{10-90} = 2.47 \, \text{ns}$ |
| Pulse width, full width at half maximum | $\text{FWHM} = 23.0 \, \text{ns}$ |
| Pulse width, total energy over peak power | $W_{total}/P_{peak} = 17.3 \, \text{ns}$ |
| Spectrum width, total energy over peak spectrum power | $W_{total}/P_{low\,freq} = 18.8 \, \text{MHz}$ |

FIG. 21

METHOD AND SYSTEMS FOR DETECTION AND PROTECTION FROM ELECTROMAGNETIC PULSE EVENTS USING HARDWARE IMPLEMENTED ARTIFICIAL INTELLIGENCE

REFERENCE TO RELATED APPLICATIONS

This application claims the priority of non-provisional patent application Ser. No. 16/925,600 filed Jul. 10, 2020 titled Method for Detecting an Isolating an Electromagnetic Pulse for Protection of a Monitored Infrastructure which claims the priority of non-provisional patent application Ser. No. 16/597,427 filed Oct. 9, 2019, titled System and Method for Detecting an Isolating an Electromagnetic Pulse for Protection of a Monitored Infrastructure, which claims the priority of non-provisional patent application Ser. No. 16/240,897 filed Jan. 7, 2019 (now U.S. Pat. No. 10,530, 151), titled System and Method For Suppressing Electromagnetic Pulse-Induced Electrical System Surges, which claims the benefit of provisional patent application U.S. Ser. No. 62/615,159 filed Jan. 9, 2018 titled System and Method For Suppressing Electromagnetic Pulse-Induced Electrical System Surges, all of which are incorporated in their entirety herein by reference.

BACKGROUND OF THE INVENTION

This invention relates generally to persistent monitoring, detecting, and classifying an electromagnetic pulse (EMP) and isolating the impending effects of said pulse to prevent damage to an infrastructure such as an electrical grid or its components for generating, transmitting, distributing, and using of electrical power at commercial facility, or the like as shown in FIG. 1.

An electromagnetic pulse, also sometimes called a transient electromagnetic disturbance, is a short burst of electromagnetic energy. The waveform of EM pulse in time domain describes how the amplitude of the ultrashort pulse changes over the time and correlates to the intensity of the EMP. The real pulses tend to be quite complicated, so their simplified descriptions are typically characterized by:

The type of energy (radiated, electric, magnetic, or conducted).

Pulse waveform: shape (rise and fall time), pulse width at half maximum (PWHM), duration, and peak amplitude The range or spectrum of frequencies present and the power spectrum distribution.

Any EMP is associated with electromagnetic interference (EMI) which is classified based on the frequency content of their spectral densities as "narrowband", "wideband" and "ultrawideband" distributed in different frequency ranges. The frequency spectrum and the pulse waveform are interrelated analytically via the Fourier transform and other mathematical transformations for joint time-frequency representation (wavelets, spectrograms, etc.). An EMP typically contains energy at many frequencies from direct current (DC) to some upper limit depending on the source. The shorter the pulse (which also implies a short rise time) the broader the spread over a range of frequencies. The commonly used relation is $f_h = 0.35/\tau_r$, where $f_h$ is the high frequency range (Hz) and $\tau_r$ is the rise time of the pulse (sec) from 10% to 90% of its peak amplitude.

An electromagnetic pulse, or EMP, can be generally characterized as a short duration burst of electromagnetic radiation generated by either natural events or man-made activities. Some examples include natural Coronal Mass Ejection (CME), Geomagnetic Disturbance (GMD), EMP associated with nuclear blast, and Directed Energy Weapons (DEW) which are also known as Intentional Electromagnetic Interference (IEMI). In this document, the term "EMP" is used to describe also the electromagnetic fields generated in association with the detonation of a nuclear weapon at high altitude as illustrated in FIG. 17. Please note that FIG. 17 to FIG. 29 are included to supplement the description of the physical phenomena, their modeling and simulation in addition to the figures which are directly pertinent to the invention.

In general, the interactions of the high-energy gamma rays with atoms in the atmosphere produce electrons which interact with the Geo-magnetic field producing EM field with a Poynting vector from the burst source towards the Earth's surface. The field generated by a high-altitude EMP (HEMP) has direction variation along a north-south central line and over the horizon extended effects, as illustrated in FIG. 18. FIG. 18 is a pictograph of HEMP and the EMF Poynting vector direction with respect to observer's location. The main reason for the location variability of the EMP is the Geo-magnetic field distribution. Some additional relevant factors will be discussed further while the detail specifics of the related physical phenomena are beyond the scope of this application. The terms "EMP" or "HEMP" as used herein refer to the electromagnetic pulse generated by a weapon such as a nuclear blast (HEMP), directed energy system for high-power microwave (HPM) generation, other devices for IEMI or natural EMP events such as Coronal Mass Ejection (CME), supernova explosion, and other cosmic phenomenon resulting in Geomagnetic Disturbance (GMD) and large scale EMP effects.

An EMP event is capable of inducing voltages and corresponding currents into different electrical systems and depends on the coupling of the EM field with the system (its susceptibility) and the characteristics of the EM wave (direction, polarization, frequency content, and others). as the exposed transmission lines of wide-area power distribution grids, as well as the electrical systems of localized minigrids, renewable energy systems, homes, commercial buildings, and even vehicle electrical systems. Unless monitored, detected, isolated, or suppressed, that unwanted induced current and over-voltage surges can damage or destroy components within the electrical systems in the area of impact, diminishing the operability of the electrical system or oftentimes rendering it unusable until repaired. Timely and successful protection is possible only with a persistent monitoring and rapid detection of the E1 HEMP. As seen in FIG. 18, due to its origin, a HEMP will induce effects in a very large area. Similarly, it is understood that a massive solar ejection (CME) reaching the Earth imposes damaging effects on electrical infrastructure. CME from the Sun is an eruption of super-hot plasma that spews charged particles across the solar system, disturbs the Geomagnetic field, and induces over-currents in the electrical grid resulting in overheating and damaging of transformers, and failure of components within the electrical grid.

Unlike the electromagnetic radiation or pulse associated with common natural phenomena (lighting strikes, transmission lines overvoltage, and overcurrent surges, etc.), the HEMP comprises of more complex time and frequency domain characteristics. Historically, the HEMP is described with several stages (phases or pulses) of varying waveform: magnitude, rise and fall time, duration, etc. Therefore, the HEMP is more accurately considered as a complex, electromagnetic multi-pulse event, usually described in terms of sequence of three primary components defined by the International Electrotechnical Commission (IEC) as E1, E2, and E3 phases of the high-altitude EMP (HEMP). The characteristics of these phases (pulses) of HEMP are further described in this application. The relative electric field strength of the phase sequence is displayed in FIG. 19 using logarithmic scales for E (V/m) vs Time (s). Some of the commonly used analytical expressions for the phases are given in FIG. 20.

Starting in the 1960s, the IEC has developed multiple standards related to the description of the associated waveforms and known as IEC 77C Standards. The evolution of the unclassified standards with respect to the E1 HEMP can be seen in FIG. 21, Table 1 and details of the associated waveform energy and spectral characteristics are given in FIG. 21, Table 2.

As can be seen from Table 1 in FIG. 21, the most common analytical expressions for E1 HEMP are the Difference of double exponential (DEXP) and the Quotient of exponentials (QEXP). The plots of DEXP and QEXP in time domain and their respective spectral distribution in frequency domain are presented in FIG. 22 with variations of rise and fall times, pulse width at half maximum, and frequency content. These variations are expressed in the IEC 77 standards specifications.

The damage to electrical and electronic devices is determined by the amount of energy that is transferred to devices in the electromagnetic environment and all electrical or electronic equipment is susceptible to the malfunctions and permanent damage under the electromagnetic radiation of sufficient intensity. The plots in FIG. 23 illustrate the frequency spectrum associated with a HEMP E1, lightning, and IEMI (high-power microwave, high-intensity RF).

The level of system vulnerability is dependent on the intensity of the EMF and the coupling of the external fields to the electrical circuits and the sensitivity characteristics of circuits components. A temporary malfunction (or upset) can occur when an electromagnetic field induces current(s) and voltage(s) in the operating system electronic circuits at levels that are comparable to the normal operational rating characteristics. No matter what kind of the HF source is used, or which power/frequency/mode is applied, two principal coupling modes are recognized in the literature and the relevant standards assessing how much radiated power is coupled into target systems: (1) Front Door Coupling, (FDC), and (2) Back Door Coupling, (BDC). The FDC is typically observed when the power radiated from the HF source is directly coupled into the electronic systems: more often the antenna subsystem designed to receive and transmit RF signals, and thus providing an efficient path for the power flow from the electromagnetic source to enter the equipment and cause damage especially when the antenna's bandwidth is withing the frequency range of the HF source.

The BDC occurs when the electromagnetic field from the HF source produces large transient currents (termed spikes, when produced by a transient source) or the electrical standing waves through the gaps, small apertures, fixed electrical wiring and interconnecting cables, connections to the power mains, communication cables (network and telephone copper wires), unshielded sections, and others. The BDC can generally be described as a wide-range interference at specific narrow-band susceptibility characteristics because of existing apertures and modes of coupling to cables.

Since the impinging EMP field has a broad frequency spectrum and a high field strength, the antenna response must be considered both in and out of the antenna's band. The inadvertent, unintended, or parasitic antennae are electrically penetrating conducting structures, power lines, communication cables, and others that collect EMP energy and allow its entry into a building, a device, or an enclosure. The electrical wires of the grid can be considered as a BDC pathway, but also as imperfect antennae connected to the upstream and downstream components of the grid and are susceptible to broadband frequencies, including the lower frequency (long wavelength) coupling due to the long length of the power transmission lines. Additional factors influence the level of coupling and interference: wave polarization, geolocation, ground surface conductivity, height of the wires above ground, and others. With their long length, the electrical transmission lines are especially susceptible to the E3 HEMP, as further described below.

Before an EMP can be mitigated, it must be detected in real time and mitigated as it occurs before it can cause damage to commercial infrastructure, such as to an electrical grid, its subsystem and components, commercial facility, and the like. Specifically, to protect from the damaging effects of EMP, the environment must be persistently monitored with applicable sensors and when an EMP is detected, the appropriate isolation systems has to be triggered to provide protection for the infrastructure as will be described later.

While surge suppressors and arrestors for electrical systems are known in the art, those suppressors are typically developed and optimized to address surges with relatively slow rise time (microseconds) and short duration which are caused by commonly occurring phenomena, such as lightning strikes or electrical system failures (e.g., the switching or failure of a substation's relays, transformer in the power distribution grid, high-power loads switching, or a short introduced across electrical lines). Those known surge suppressors and arrestors, however, are generally ineffective against the complex, multi-stage surges caused or generated by a weapon induced EMP pulse (IEMI) or the nanoseconds rise time of the HEMP.

Preferably, the combination of E1, E2, and E3 components of an EMP needs to be mitigated. However, the present invention recognizes that detection of only the E2 and/or E3 components of HEMP in the absence of an E1 component may cause a false alarm that a dangerous and true HEMP event is occurring. It is important to note again that lightning strikes have characteristics similar to E2 IMP and GMD results in current/voltage induction similar to E3 HEMP. In such a case, the absence of E1 HEMP detection could mistakenly result in the isolation and/or complete shutdown of infrastructure that is being monitored. The prior art, including U.S. Pat. No. 9,562,938, disclose embodiments of a system and method for detecting and characterizing electromagnetic pulses for the protection of critical infrastructure components. Although presumably effective for their intended purposes, the prior art does not yet provide a solution in the form of a system and method for detecting, isolating, and monitoring electromagnetic pulse-induced electrical system surges induced by the E1, E2, and E3 components of an electromagnetic radiation complex multi-pulse generated by the detonation of a nuclear weapon at high altitude or a regional nuclear blast. Thus, because of the complex nature of an EMP pulse, comprised of E1, E2, and E3 components, there remains a need for an improved and complete solution, system, and method for detecting, isolating, or suppressing electrical surges generated by an EMP promulgated from a detonated nuclear weapon and detection in real time withing the time duration of the fastest E1 phase of the HEMP.

It is understood that an E1 HEMP is always followed by E2 and E3 phases. E1, or early time HEMP, is also called prompt gamma HEMP. The E2 intermediate time HEMP phase is further described as E2A (scattered gamma HEMP) and E2B (neutron gamma HEMP). While the time domain profile of the E2 HEMP has characteristics similar to lightning strikes, they are different. While the lightning has a localized effect, the E2 phase of HEMP effects simultaneously a very large area (for example, the whole continental USA). With respect to spectral density, the lightening may have higher magnitudes (but localized) compared to the E1 spectral density (global area). The E3 late time HEMP, also called magnetohydrodynamic (MHD) EMP, consisting of the E3A (blast wave) and E3B (heave) MHD. The E3 HEMP generates long-lasting currents at very low frequencies for a long period of time. Compared to the HEMP, the man-made IEMI may have the characteristics similar to E1 and E2 and also additional temporal and frequency characteristics not associated with a HEMP, CME, or Geomagnetic disturbance.

Therefore, it would be desirable to have a method and system for monitoring and detecting an electromagnetic pulse and isolating a protected infrastructure (an electrical system, for example) from the hazardous effects induced by the E1, E2, and E3 components—the electromagnetic radiation, complex, multi-phase EMP generated by the detonation of a nuclear weapon. Further, it would be desirable to have a method and system that includes protection from the combination of E1, E2, and E3 pulse phases of HEMP. In addition, it would be desirable to have the means for persistent monitoring for EMP events and a method of detecting and isolating an EMP pulse using instantaneous detection and classification based on enhanced artificial intelligence algorithms implemented in hardware components for determining an E1 component of a HEMP and, as a result, operating in real time to initiate mitigation of the damaging effects of EMP.

SUMMARY OF THE INVENTION

Embodiments of the invention are defined by the claims below and not solely by this summary. A high-level overview of various aspects of the invention are given here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for detecting, monitoring, isolating, electromagnetic pulse-induced electrical system surges induced by the E1, E2, and E3 components of an electromagnetic radiation complex multi-pulse generated by the detonation of a nuclear weapon (HEMP).

With respect to E1, the detection and response must be in real time and within the rise time of the pulse in the order of 2.5 ns (10% to 90% of the peak value, refer to Table 2). The ability to detect an EMP and identify it as E1 pulse in real time is a technological challenge due to the short rise time and high magnitude (high slew rate, kV/ns). Even the most recent prior art does not provide the means for on time detection and response to an E1 EMP. Furthermore, any method based on temporal characteristics (rise time, pulse peak, pulse width, power, energy, etc.) implies that the detection can be performed after the event (E1, for example), has passed. The delay is even more prominent if the frequency characteristics (spectrum peak, spectrum width, etc.) are included in the algorithm detection method because the waveform (sensor's signal) has to be converted from analog to digital domain and process to extract its frequency content. The "receive and analyze" has an implicit delay associated with the analyze and compare with historical data (as described in U.S. Pat. No. 9,562,938, for example). In addition, the accuracy and level of confidence of the detection must be very high because a false triggered response is associated with disturbance of normal operations of multiple complex systems at a significant cost. The cost of a false positive is also very high. While prior art teaches the use of multiple sensors (electrostatic, RF, magnetic, current, etc.), no reference is made to the joint time-frequency characterization of the EM field, the field polarization and the three-dimensional (3D) variations of the EMP field with respect to geolocation and Earth's properties, distance from the source and sensor (observation point) location with respect to blast origin. All these characterization parameters create a complex multivariable representation that has to be accounted in order to properly detect an E1 HEMP with high level of confidence.

In the last decade, the applications of machine learning (ML) algorithms have proliferated in many areas of scientific, industrial, and medical applications. The algorithms have inspired the development of novel artificial neural network (ANN or NN) forming the basis of the field of artificial intelligence (AI). The developments have been in response to the vast amount of data, known as Big Data, which require new approach to their processing, storage, and information extraction. Not without some limitations, the AI continue to find new applications and provide fast information extraction based on algorithm embedded knowledge acquired with the use of available data in order to process newly available data: the process also known as NN training. Currently, there are three types of NN based on the training method: supervised—the classes or categories of the data are known a priory, unsupervised—the NN clusters the input data based on some criteria (cost or loss function), and a hybrid type—when the classes are not completely defined and, in many cases, the data is sparse as well.

In general, modern AI systems are capable to classify with high precision very complex data. However, the speed of processing and classification is in the order of hundreds of microseconds ($\mu$s) to milliseconds (ms) to seconds (s) even with fast multicore processing systems. The speed obviously depends on the input data throughput and variation. Nevertheless, remarkable achievements have been accomplished with respect to image classification (2D data) using multi-core Graphic Processing Unit (GPU) and voice recognition (1D time series data) with integrated circuits (IC) developed for the expanding Internet of things (IoT) and edge-computing applications.

Given the short rise time of E1 HEMP, processing, and classification in the order of milliseconds ($10^{-3}$ s) and microseconds ($10^{-6}$ s) is not sufficient for useful, on time response to E1 HEMP in order to mitigate the effects of E2 and E3. Fortunately, there are developments of modern hardware that enables the implementation of software algorithms (algorithms in general) and execution of their application in hardware, most commonly known as Field Programmable Gate Arrays (FPGA). Used as "accelerator" cards, FPGAs are commonly used to expand system capabilities beyond those of a general-purpose Central Processing Unit (CPU).

An FPGA provides not only the logic elements but also a significant number of configurable interconnections. These interconnections provide different logic elements and allow for the generation of more complex entities, such as state-machines, counters, adders, etc. These entities, in turn, can be combined to form complex modules or even entire systems, also called system-on-chip (SoC). In addition to the logic elements and its interconnections, most FPGAs also provide an infrastructure, which consists of one or more clock generators, I/O ports, and embedded memory cells.

While the capabilities of FPGAs continue to grow, there are some developments that address limitations and target additional flexibility of embedded applications. Marketed as adaptive silicone, instant silicon solution platforms, flexible logic, in memory processing, and other new platforms address specific implementations with combination of application specific integrated circuits (ASIC) and embedded FPGA (eFPGA). Without the loss of generality, this invention describes algorithms embedded in FPGAs with the understanding that embedded systems using other hardware platforms, available now or in the future, are not only possible but may and will be used to improve the performance of the method and devices described here.

To provide real time signal processing, monitoring, detection, and classification with an instantaneous response to trigger protective actions, the invention describes a method based on algorithms implemented in hardware. This includes: (1) analog signal processing of the 3D sensors for signals' amplitudes variations in time, i.e. no complete sampling with post-processing but rather instantaneous evaluation; (2) algorithms implemented in hardware (such as eFPGA, for example) to provide real time detection and classification; (3) the implemented algorithms are based on different hardware implementation of neural networks (NN) for machine learning (ML) and artificial intelligence (AI); (4) the ML/AI algorithms are trained using standard-defined test waveforms and recorded historical data of E1, E2, and E3 HEMP signals synthetically augmented to increase the training data sets; (5) more than one processing and classification units are used to provide detection accuracy based on data fusion, redundancy, and robustness; (6) data fusion and voting mechanism to increase the confidence of the classification decision; (7) the hardware is based on hardened electronics and is housed in EM shielded enclosures. All of the elements will be described in detail later.

When an E1, E2, or E3 EMP event is detected and classified, an appropriate response action must be triggered to provide isolation of the protected infrastructure. The invention describes a method and devices based on the method that include a Control and Communication module which is connected to and communicates with a local isolation actuator or actuators at the point of monitoring and/or at a desired remote location or locations. The isolation actuators provide protection to the associated infrastructure by disconnecting the electrical connections, shunting, or the like.

In one aspect, electromagnetic signals upstream from a protected infrastructure or at distributed space locations are continuously collected, processed, and monitored so as to determine (1) if an E1 component of an HEMP is detected and if a command needs to be issued for the infrastructure to be disconnected (isolated) and protected from the detected event or (2) if the monitoring simply continues, i.e. until signals with predetermined characteristics are detected that classified as a hazardous event to initiate immediate isolation response. For instance, the present invention includes a module referred to as Detection, Isolation, and Monitoring of EMP (also referred to as DIME) with an artificial intelligence-based (AI-based) algorithm implemented in hardware for real time response. For the purpose of brevity and recognition, the overall hardware implementation of the system will be referred to as DIME AID (or DIME Aid). The implementation in hardware such as FPGA is used to describe the approach without the limitation for use of additional hardware to form a system on a chip (SoC) or combination of flexible (programmable) modules and application specific integrated circuits (ASIC).

Multiple device configurations may be implemented to address specific need and applications. Respectively, the devices based on the current invention may be labeled or referred to with different acronyms. For simplicity, the acronyms DIME Aid or DIME AID will be used in the current document and will refer to the device implementation of the method described in this invention including part or all subsystems. The DIME Aid will be described with more details later.

DIME Aid refers to an EMP protection device capable of isolating protected equipment and infrastructure and notifying for a detection of E1 HEMP. The developed proprietary algorithms are implemented in hardware and the DIME Aid is immune to cyber security threats with its inherited one-way communication and limited numbers of proprietary coded commands. The proprietary ML/AI-based algorithms of the DIME Aid can monitor signals with sub nanoseconds characterization and identify the signature of a HEMP E1 pulse instantaneously (300 nanoseconds or less). Upon positive signature detection/classification, the DIME Aid generates a local isolation signal in less than 300 nanoseconds to ensure protection for the connected equipment (referred to herein as the "protected infrastructure" or PI) prior to the E2 and E3 phases of the HEMP event.

As stated previously, an E1 HEMP is always followed by E2 and E3 phases of the HEMP. When an E1 HEMP event is detected and classified, an appropriate response action must be triggered to provide isolation of the protected infrastructure (PI). The Control and Communication module (CCM) of the DIME Aid issues a command to the local isolation actuator or actuators at the point of monitoring and/or at a desired remote location or locations.

The DIME Aid provides persistent monitoring of the plurality of sensors for an EMP event and the input signals with predefined waveforms (signatures) are stored locally and periodically transmitted to a centralized location for future use (i.e., model updating and NN training). Combined processing of multiple DIME Aid installations provides triangulation for location and identification of IEMI source activity. This capability can be used to identify activation and use of electronic warfare (EW) EMP systems for single or coordinated intentional EM interference (IEMI).

For instance, if the monitored and collected signal data is indicative of an E1 HEMP component, then a signal is sent to actuate immediate physical isolation and protection of the associated infrastructure. However, if the E1 component is not identified, such as if signals resembling E2 (lighting) or IEMI component is detected (HPM source), or if no surge is present whatsoever, then collected signals are classified as such and monitoring continues (persistent monitoring mode). It is to be noted that E3-like events may be associated with geomagnetic disturbance and in such cases a priory information may be available and communicated from the space-weather monitoring stations. For example, a satellite probe placed at the gravitationally stable Lagrange point 5 (L5) will view the Sun's surface region that will spin to face Earth in 4-5 days. In this regard, mitigation of CME and GMD are less demanding with respect to rapid detection and response. The means for monitoring, collecting, and transmitting signals will be discussed in detail later.

In another aspect of the comprehensive EMP protection solution, the system and method according to the present invention may determine that the monitored infrastructure needs to suppress the electromagnetic pulse-induced electrical system surges that are detected, the system comprising a plurality of shunts placed between, and in electrical communication with, a plurality of power lines in an electrical system, such that a voltage differential between electrical power lines that exceeds a predetermined level is shunted by at least one of the plurality of shunts to prevent the voltage differential from exceeding the said predetermined threshold level.

In this suppression aspect, the response time of the plurality of shunts and the allowable differential voltage level of the shunts are selected and combined to achieve a desired response time and protection level to react to the E1, E2, and E3 components of a complex, HEMP generated by detonation of a nuclear weapon.

In a further aspect regarding EMP-based and HEMP-based effects suppression, the system and method protect line-to-line, line-to-neutral, neutral to ground, and line-to-ground arrangements of an electrical system's power lines, as well as combinations and sub-combinations thereof, as described previously in U.S. Pat. No. 10,530,151. In this regard, the system and method of the present invention are configured to protect single-phase and three-phase electrical systems: from land-based in the air and subterranean transmission lines to offshore power generation and submersible electric power distribution. In further alternative embodiments, the system and method are configured for use on the electrical systems of vehicles, such as standard automobiles, hybrid and electrical vehicles, trucks, locomotives, boats, aircraft, and other vehicles employing on-board electrical systems.

Further, the implementation of the readiness of the system ("active health" status) aspect may include operational testing and tracking that is periodic/automatic as well as on-demand and real time "challenge" mode testing and tracking to verify the status and the operational functionality readiness of the deployed monitoring and protection systems.

When an E1, E2, or E3 HEMP event is detected and classified, an appropriate response action must be triggered to provide isolation of the protected infrastructure. However, if the E1 component is not indicated, such as if only an E2 or E3 component is indicated (or if similar waveforms are identified or there is no surge at all), then monitoring of the signals continues and no isolation is initiated. The means for collecting, monitoring, and transmitting signals will be discussed in detail later. The Control and Communication module is connected to the local isolation actuator or actuators at the point of monitoring and/or at a desired remote location (or locations). Some of the important design and implementation features are:

- The local and remote isolation actuators are preferably connected to the Control and Communication module (CCM) via an optical link to eliminate the susceptibility of the unit to EM radiation and interference.
- A wireless communication channel may be provided for redundancy and it is preferably implemented to use 3 MHz to 30 MHz frequency range.
- The CCM and the antenna have dedicated EMP protection components installed.
- The antenna for the wireless communication channel is normally electromechanically disconnected to eliminate EMP vulnerability of the communication channel (sometimes called "front door" EMI coupling) and is connected when transmission is initiated.
- The data transfer may be encoded, encrypted, and/or scrambled for increased security.
- The communication is implemented with a proprietary protocol and the data transmission is mostly one-directional from CCM to the local and remote isolation actuators.
- A limited set of commands with unit identification (unique ID) is provided for communication authorized access from a remote portal using exchange key authentication and alert mode notification for an unauthorized access attempt.
- The implementations use hardened electronic components with an enhanced shielding and surge suppression.

In another aspect of the comprehensive system of systems EMP protection solution, the system and method according to the present invention may be expanded with auxiliary protection devices. When the DIME Aid determines that the monitored infrastructure needs to be protected from detected electromagnetic pulse-induced electrical surges, the auxiliary system comprising a plurality of shunts placed between, and in electrical communication with, a plurality of power lines in an electrical system, such that a voltage differential between electrical power lines that exceeds a predetermined level, protection is provided by at least one of the plurality of shunts to prevent the voltage differential from exceeding a desired level.

In this suppression aspect, the response time of the plurality of shunts and the allowable differential voltage level of the shunts are selected and combined to achieve a desired response time and protection level to react to the E1, E2, and E3 components of a HEMP generated by detonation of a nuclear weapon.

In a further aspect regarding suppression, the system and method protect line-to-line, line-to-neutral, neutral to ground, and line-to-ground arrangements of an electrical system's power lines, as well as combinations and subsystem combinations thereof. In this regard, the system and method of the present invention are configured to protect single-phase and three-phase land-based electrical systems. In further alternative embodiments, the methods of the invention are configured for use on the electrical systems of vehicles, such as automobiles, trucks, locomotives, boats, aircraft, satellites, unmanned autonomous vehicles, and other land, air and sea vehicles employing on-board electrical systems.

BRIEF DESCRIPTION OF THE DRAWINGS

Illustrative embodiments of the invention are described in detail below with reference to the attached drawing figures, and wherein:

FIG. 11 is an exemplary illustration for the fast, in memory processing of a sensor signal with coding and classification of an EMP represented as time series of the signals from three X, Y, and Z sensors places on three orthogonal axes and producing time domain characterization: rise time, peak value, slew rate, pulse width at half maximum.

FIG. 21 displays two tables: Table 1 illustrates the evolution of waveform standards for E1 HEMP; Table 2 displays details of the latest IEC standard for E1 HEMP waveform characteristics.

DESCRIPTION OF THE PREFERRED EMBODIMENT

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

Before the present invention regarding detecting, isolating, and monitoring an electromagnetic pulse so as to protect a monitored infrastructure can be described in detail and in context, a deeper understanding of the characteristics of an EMP, in general, and HEMP, in particular, will be discussed in the context of traditional electrical environments and setups.

Figure 19:
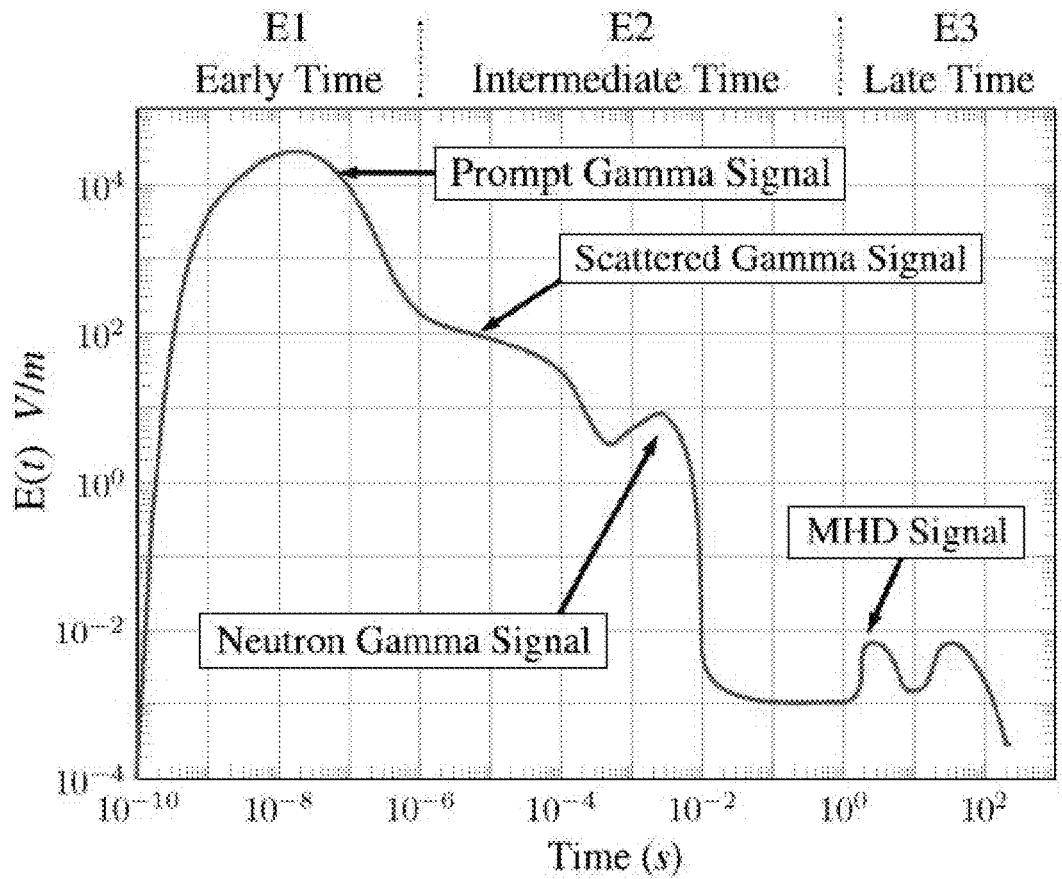
FIG. 19 is a logarithmic scales graph of the electric field intensity (V/m) in time (s) with indication of Early time E1, Intermediate time E2, and Late time E3.

As initially presented above, an EMP generated by detonation of a nuclear weapon comprises a sequence of waveforms due to the multiple and complex interactions of the product of the nuclear blast with Earth's atmosphere and geomagnetic lines. Multiple phases (pulses of varying duration) are used to describe/represent the HEMP more accurately. In this regard, the HEMP is considered a complex, electromagnetic multi-pulse, usually described in terms of three primary components defined by the International Electrotechnical Commission (IEC) as E1, E2, and E3. The three phases of the HEMP are presented in FIG. 19. The nature of these pulses is described below.

The E1 component of the complex multi-pulse is produced when gamma radiation from the nuclear detonation knocks electrons out of the atoms in the upper atmosphere. The electrons begin to travel in a generally downward direction at relativistic speeds (i.e., at more than 90 percent of the speed of light). In the absence of a magnetic field, the displaced electrons would produce a large pulse of electric current vertically in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very brief, but very high magnitude, electromagnetic pulse over the affected area.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The strength of the E1 HEMP depends upon the altitude of the detonation of the nuclear device and the atmosphere conditions and to the intensity of the gamma rays produced by the weapon. of the more detail explanations of the undergoing physical interactions are beyond the scope of this document and may be found elsewhere.

Figure 20:
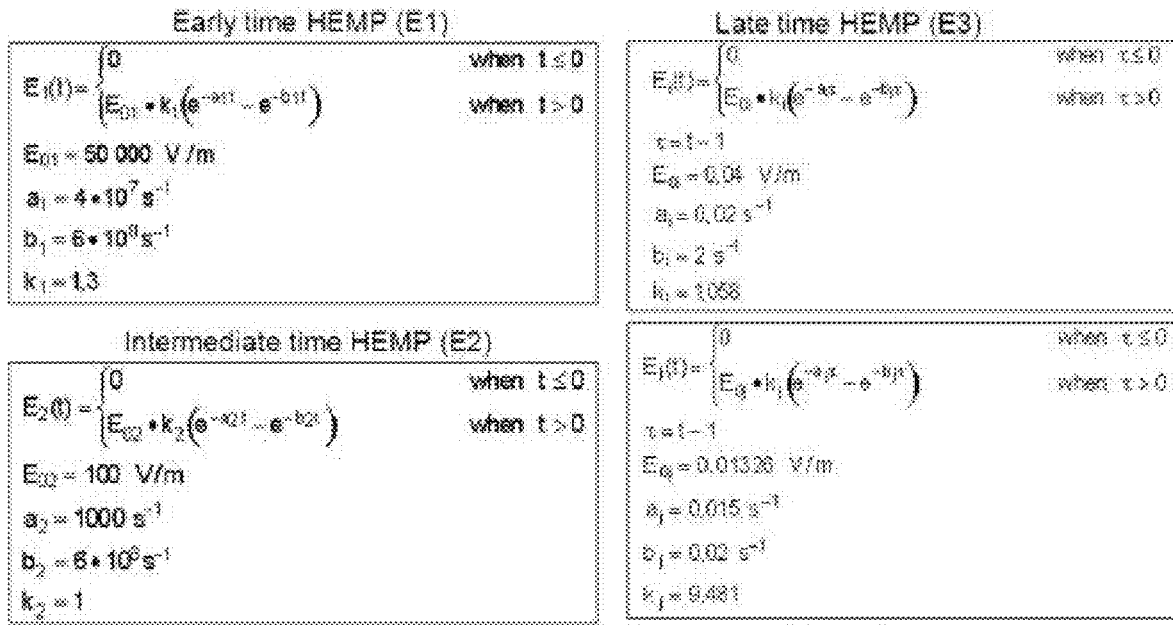
FIG. 20 displays the numerical values for the waveform models of Early time E1, Intermediate time E2, and Late time E3.

The interaction of the very rapidly moving negatively charged electrons with the magnetic field radiates a short duration, intense pulse of electromagnetic energy. The pulse typically rises to its peak magnitude in about five nanoseconds (5 ns) and decays within hundreds of nanoseconds (200 ns-500 ns, depending on the level of intensity used for measurement). The given values may vary based on location and distant to the blast point. According to the most recent IEC standard update, the E1 pulse has a rise time of 2.5 ns±0.5 ns (from 10% to 90% amplitude levels), reaches peak value of 50 kV/m in 5 ns, and has a pulse width at half maximum of 23 ns±5 ns (FIG. 20, FIG. 21, Table 1, and FIG. 21, Table 2).

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to respond and suppress the surge induced into an electrical system by an E1 pulse.

The E1 component is further characterized in the certain regulatory standards. Table 1 in FIG. 21 gives a better understanding for the characteristics of the E1 phase of the HEMP. There are several HEMP environment standards, and some are classified such as DoD-STD-2169. Others are public knowledge such as IEC STD 61000-2-9, MIL-STD-188-125-1, MIL-STD-461G, and MIL-STD-464C. The first HEMP related standard was created by Bell Labs in the 1960s. Since then, revisions have been made as can be seen from Table 1 in FIG. 21. In general, the parameter values do not present geolocation variations with respect to altitude, distance, atmosphere conditions, field vectors direction, and local Earth surface properties, which impact the formation, propagation, and reflection of the EM field.

Figure 22:
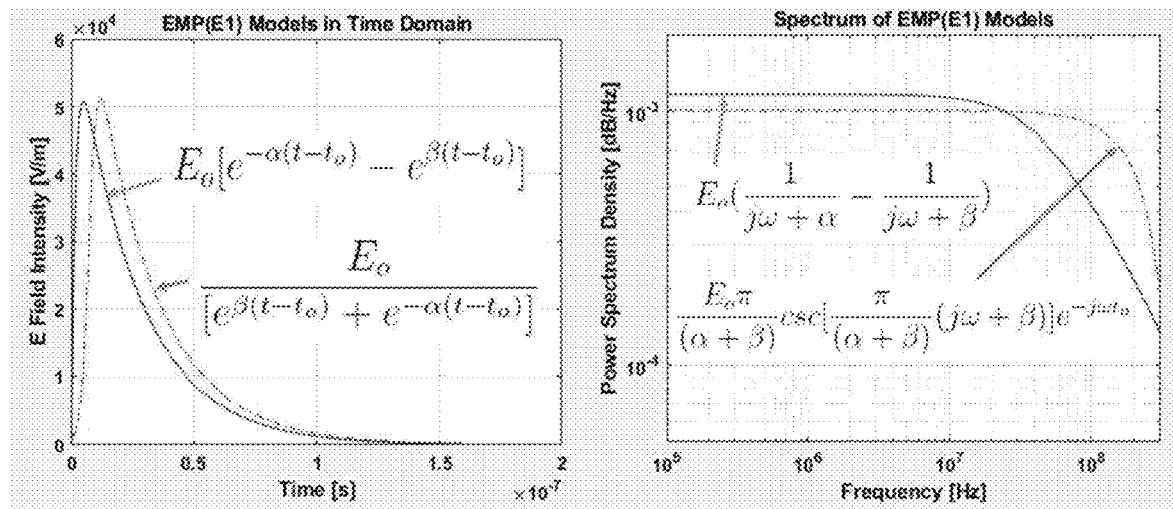
FIG. 22 is an illustration of the two most commonly used waveforms for E1 HEMP: the double exponential difference (DEXP) and the quotient exponential difference (QEXP) waveforms in time domain (left) and their frequency content (right).
Figure 23:
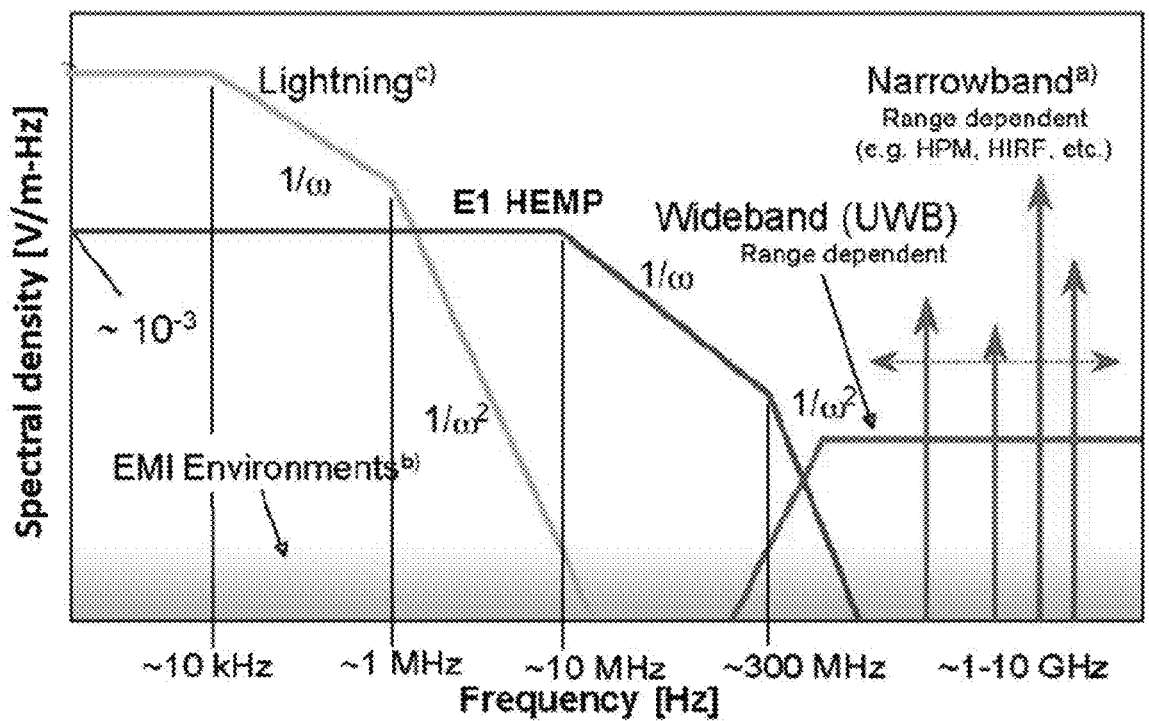
FIG. 23 is an illustration of the spectral density distribution of E1 HEMP in comparison with lightning and man-made intentional electromagnetic interference (IEMI) of wide-band and narrow-band sources.
Figure 24:
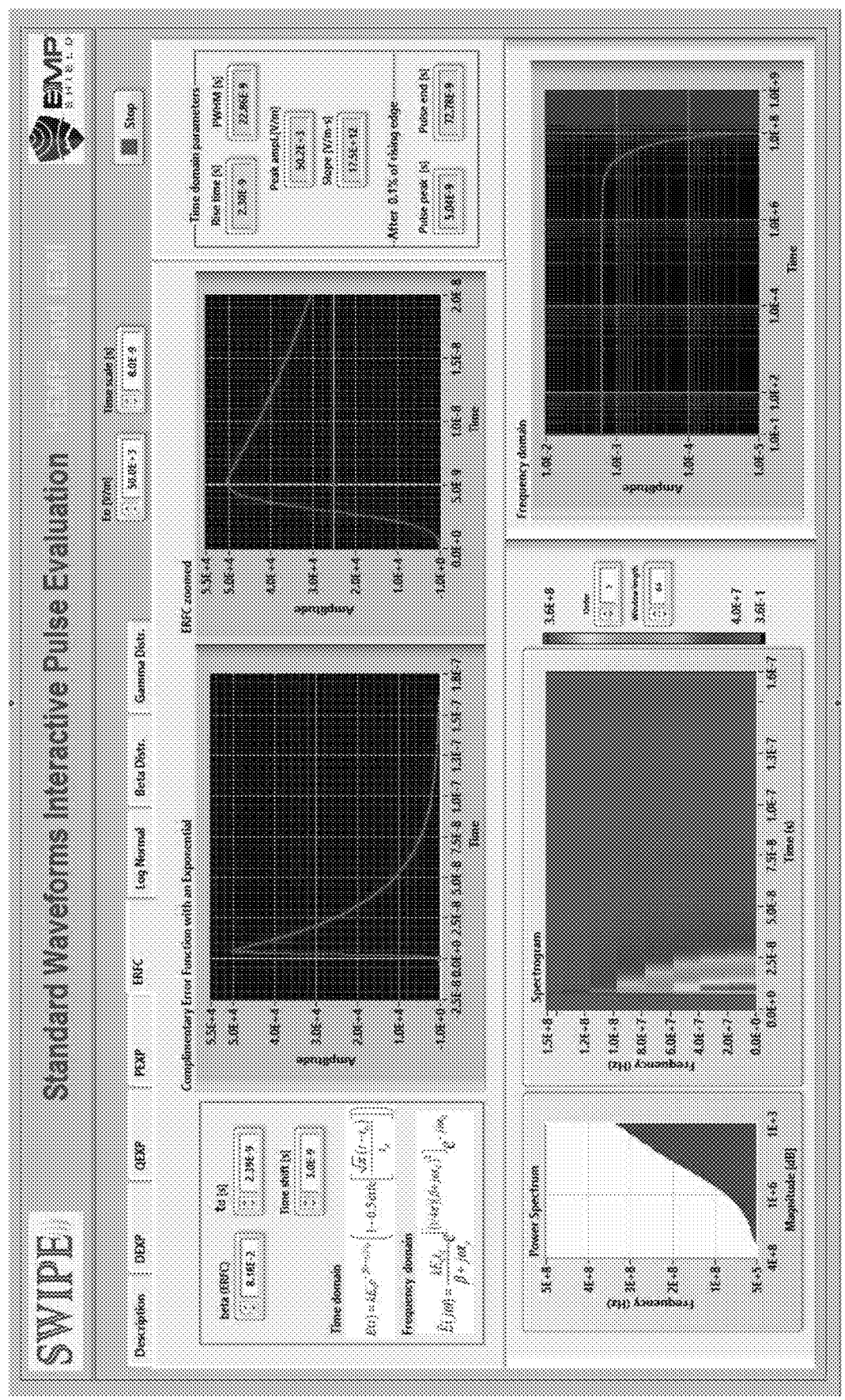
FIG. 24 is a screenshot of GUI for interactive visualization of E1 HEMP waveform models in time domain, frequency domain, and joint time-frequency domain.

Two of the well accepted and used analytical expressions of HEMP are provided in IEC 61000-2-9 and given for a reference in FIG. 22. The combined HEMP timeline based on analytical expressions is provided in IEC 61000-2-9 and is given in FIG. 19. Unclassified HEMP standards characterize the E1 phase of the EMP by idealized Difference of double exponentials (DEXP) and quotient exponential (QEXP) waveforms, as shown in FIG. 22 with the blue solid line and red dash-dot line, respectively. FIG. 22 displays the EMP test waveforms in time-domain (left) and their respective spectral content (right). The evolution of the E1 HEMP standards is presented in FIG. 21, Table 1. The $\alpha$ and $\beta$ are the exponential constants and k is a normalizing constant for the peak amplitude at the cross section of the two exponentials. In addition to the DEXP and QEXP, two other analytical forms have been developed and presented in the literature: the P-index exponential (PEXP) and the Complimentary error function (ERFC). The main reason for these additional analytic models is some of the deficiencies of the first two models. For example, the DEXP model is discontinuous at t=0, while QEXP extends to t=∞ and has an infinite number of poles in the frequency domain. In order to rigorously explore the models, the authors of this application have developed software to interactively demonstrate and comparer the different models. FIG. 24 presents a screen capture of the GUI for interactive evaluation of the existing HEMP environment models.

In addition to the published models (DEXP, QEXP, PEXP, and ERFC), three new models were developed based on Log-normal, Beta, and Gamma distributions. The software was used to visualize the time domain and frequency domain characteristics of the models. The software includes the display of joint time-frequency domain characteristics using a spectrogram and the power spectral density. The user has the ability to interactively change the parameters of the models and observe the changes of the pulse parameters. The rise time, the amplitude peak value and the time of peak value, the slew rate (the slop of the rising edge), the pulse width at half maximum, and the total duration of the pulse (when the amplitude of the peak decreased to 10% of its peak) are calculated. The software was designed to study the differences of the model, to generate multiple pulses using different models and to create datasets with different pulses to be used for the development of the detection algorithms.

Figure 25:
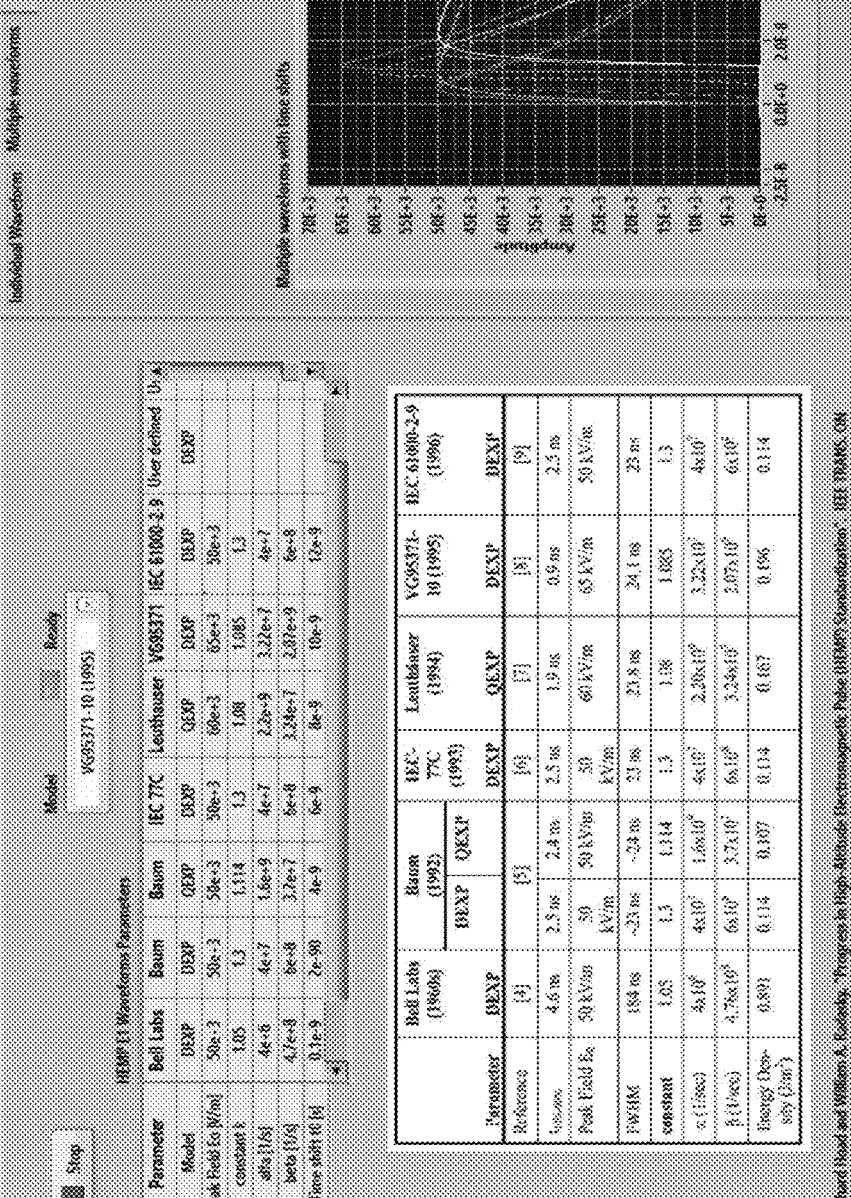
FIG. 25 is a screenshot of the GUI for display and comparison of the E1 HEMP standards waveform evolution.

The method and devices based on the method described in this invention are based on specifications listed in the Military and Civilian Standards and are developed accordingly for accurate description of E1, E2, and E3 pulse components of a HEMP. The standards are used to design and build test facilities to study the impact of HEMP effects and to design, implement, and evaluate the level of protection of devices built for mitigation of the effects. The authors have implemented in software tools to generate the waveforms described in all publicly available standards (FIG. 25). The user can generate the E1 HEMP based on the specific standard and observe the time and frequency domain graphs.

In addition, the user of the software can construct different waveforms similar to the waves describes in the standards with user-defined parameters. Multiple plots can be superimposed on a single graph for visual comparison. The generated waveforms can be stored and used for algorithms development (i.e., NN models training and waveforms classification).

The HEMP standards are derived by considering many possible waveforms in time and frequency domains. The mathematical models are created that best expresses the temporal and the spectral characteristics. The detection of E1 EMP is the most challenging, requiring ability to monitor the sensors' signals with sub-nanosecond resolution. The two models for the E1 EMP given in FIG. 22 have their advantages (simple analytical forms) and disadvantages: the double exponential model is discontinuous at t=0, while quotient exponential has the advantage of a continuous time derivatives for all orders but also the disadvantage of in that it extends to t=∞ and has an infinite number of poles in the frequency domain. The model waveforms are useful for testing, but they do not present with high fidelity the complexity of the real HEMP E-field waveforms.

Based on the presented description of HEMP related waveforms, their variability causes additional challenges for accurate detection. In recent years, ML and AI have demonstrated their capability to classify broad range of data with NNs built with applicable architecture, good models, and proper training. AI has become an enabling factor in many applications. In addition, with the developments of technologies related to real time processing of sensor signals (for example, 1D and 2D sensor for autonomous vehicles), the implementation of algorithms in dedicated systems on a chip has gained momentum. Multiple new devices have been developed dedicated direct application of ML/AI as stand-alone Internet of things (IoT) nodes and edge computing modules. In that regard, the authors of the application have used the potential of ML/AI and apply it to the detection of HEMP E1. One substantial challenge and constraint is the limited amount of data for the developing of the AI algorithms.

Figure 26:
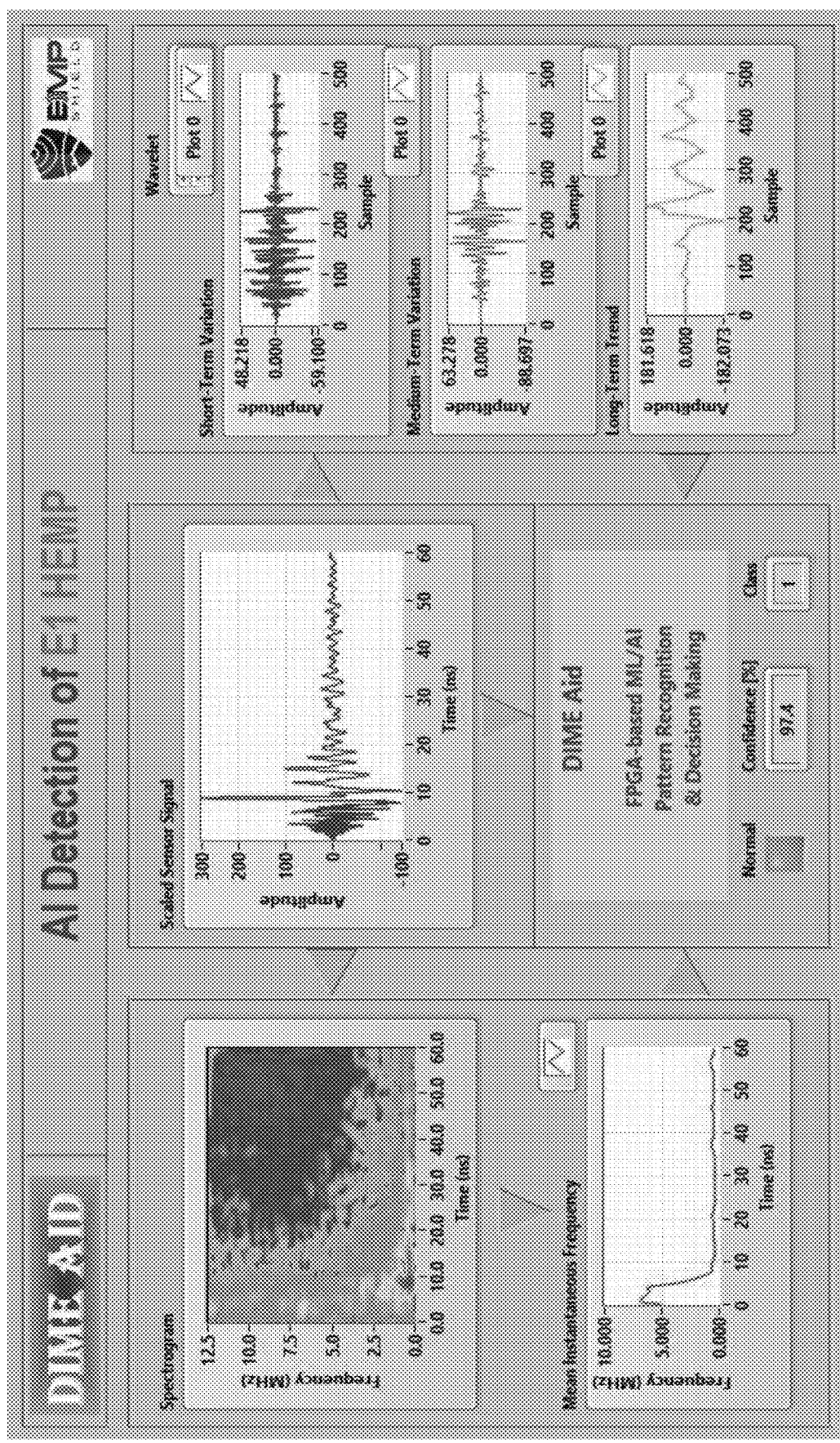
FIG. 26 is an example of tools developed for the extraction of waveform features from the sensor signals design and used to train the machine learning and artificial intelligence algorithms.

It is to be understood that multiple software and hardware tools have been used to model, simulate, generate, process, and represents HEMP waveforms. They were used to create datasets of synthetic waveforms with variations to complement and expand the standards' models. Detection and classification algorithms were developed using standard processing computers. The algorithms were designed to characterize time domain, frequency domain, and joint time-frequency domain parameters as described previously. FIG. 26 displays the front panel of a software for joint time-frequency characterization of sensors' waveforms using spectrograms and wavelet representation of E1 HEMP and AI NN for waveforms classification.

We have used ML and AI in different applications. With the recent developments of enabling hardware (processing speed and computational resources), the real time detection of ns time frame signals is feasible. The limited test data for NNs training has been addressed by the development of a generative-adversarial (GA) model for fast and reliable signal analyses. The limitation of traditional ML techniques in HEMP signal analyses is the need for an exhaustive amount of training data for model generalization and accurate predictions. GA models overcome this limitation by first learning true data distribution from a small training set, from which new samples assimilating true data are generated with some variations. Subsequently, GA models can transfer classification and super-generalize with increased accuracy. In some applications, GA NN have demonstrated ability to accurately predict events from a small training set of data about the event characteristics.

The basic architecture of DIME Aid (AI device) stems from the latent encoding of E1 HEMP analytical models, synthetic waveform generation, and NN implementation in combination with an adversarial network, and it is designed to generate HEMP classification data from learned historic data (very limited) and mostly based on data models distributions for prediction purposes.

Different types of NNs have been used in applications related to the electrical grid. From multilayer perceptron (MLP) and deep feed-forward neural networks (DFFNNs), to latent encoding of atypical perturbations (LEAP) networks for system identification. A supervised graph convolutional neural network (CNN) was used for predicting an optimal load-shedding ratio that prevents transmission lines from being overloaded under line contingency. Similarly, a graph NN solver was proposed which generalized the grid topology information to achieve zero-shot learning. The proposed model was able to converge faster than a fully connected NN and also was capable of predicting power flow in grids on which it was never trained. The advantage of LEAP networks, for example, is that they do not require an explicit description of the grid topology under analysis. However, one distinctive similarity on the NNs to the electrical grid applications is that they all operate in relatively low speed compared to the processing speed required from the E1 HEMP event. The combination of new NN architecture with algorithms implementation in high clock frequency hardware is critical to the successful detection and classification of E1 HEMP in real time applications.

It is to be noted that the HEMP waveforms are 1D time series as described previously in the text. The existing Time-Series Classification (TSC) methods may be categorized from different perspectives. Regarding the feature types, time-domain methods include autocorrelation, autoregression, and cross-correlation analysis. The frequency-domain methods include spectral analysis and wavelet analysis. Regarding the classification strategy, it can also be divided into instance-based classification (IBC) and feature-based classification (FBC) methods. The IBC measures similarity between any incoming test sample and the training set and assigns a label to the most similar class based on similarity evaluated with a cost function. For example, the Euclidean distance based 1-Nearest Neighbor (1-NN) and Dynamic Time Wrapping (DTW) are two popular and widely used methods of this category. The FBC first transforms the time-series into the new space and extract more discriminative and representative features in order to be used by a pattern classifier, which has better classification boundaries. Details of the IBC and FBC applications are described further with reference to associated figures.

ML/AI has made progress in time series related to speech recognition, biomedical signals, and others. We have used many of the available algorithms and have evaluated their applicability for fast pulse recognition. While the majority of Time-Series Classification (TSC) literature is focused on 1D signals, we have extended the ML/AI with the use of recent developments for 2D (image) recognition. One approach is to use fast transforms to convert the 1D time series to 2D representations and using Convolutional Neural Networks (CNN) for the image recognition task. CNN is one of the most popular deep learning (DL) models and in comparison, to the traditional FBC, CNN does not require hand-crafted feature vectors. Both feature learning and classification parts are unified in one model and are learned jointly. Therefore, their performances are mutually enhanced. Multiple layers of different processing units (e.g., convolution, pooling, sigmoid/hyperbolic tangent squashing, rectifier, and normalization) are responsible to learn (represent) a hierarchy of features from low-level to high-level.

Figure 27:
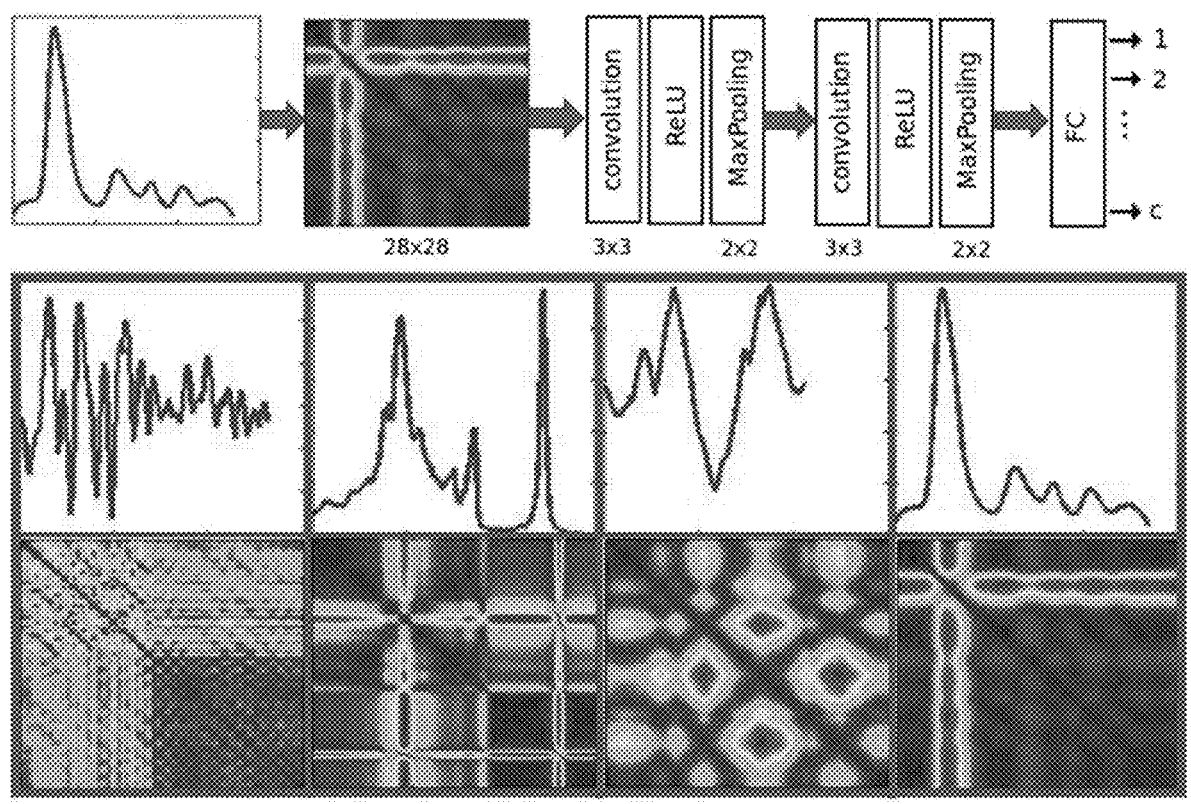
FIG. 27 is an example for a convolutional neural network (CNN) architecture and the 2D representation of 1D time-series sensor signals developed and used to facilitate the classification of the waveforms.

In order to transform the time series data to images, the Gramian angular fields (GAF) and Markov transition fields (MTF) are commonly used to encode time-series signals as images. Afterwards, a Tiled CNN model is applied to classify the time-series images. Another similar work applied visual descriptors such as Gabor and Local Binary Patterns (LBP) to extract texture features from time series, and then used Support vector machines (SVM) classifiers. A subset of the DIME Aid algorithms automatically learns the texture features that are useful for the classification layer. The joint learning of feature representation and classifier offered by CNN increases the classification performance. FIG. 27 offers an illustration for the advantage of 1D to 2D conversion and classification. The block-diagram present a typical architecture of CNN. The time series and their image representations are given for four different waveforms.

The most critical aspect regarding the E1 HEMP detection is the processing speed of the signals. The E1 phase is followed by the E2 and E3 components of the HEMP. In this regard, an accurate detection of E1 can be confirmed with a consecutive detection of the E2 phase complex multi-pulse (generated by scattered gamma rays and inelastic gammas produced by neutrons emitted by the weapon). However, the E2 component is a pulse of intermediate time duration that, by IEC definition, lasts from about one microsecond (1 μs) to one second (1 s) after the beginning of the electromagnetic pulse. The E2 component of the pulse has many similarities to an electromagnetic pulse produced by lightning, although the electromagnetic pulse intensity induced by a very close-proximity lightning strike may be considerably larger than the magnitude of the E2 component of a nuclear EMP. In applications where the false positive detection has a very high cost and a microsecond detection lag is acceptable, E2 detection can be used for conformation.

Because of the similarities to lightning-caused pulses and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that it immediately follows an E1 component which likely has damaged any devices that were intended to protect against a lightning strike type surges and that could have potentially protected against an E2 component pulse alone. As noted in the United States EMP Commission's Executive Report of 2004, referring to the E2 component pulse, "[i]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

The E3 component of the complex multi-pulse is a pulse with a very long rise and fall times (long period of oscillations) and lasts tens to hundreds of seconds. It is caused by the nuclear detonation heaving the Earth's magnetic field out of the way, followed by the restoration of the magnetic field to its natural place. The E3 component has similarities to a geomagnetic storm caused by a very severe solar corona mass ejection (CME), or stellar-induced EMP's from stellar gamma ray burst sources, supernova, hypernova and collisions of neutron stars. Similar to a geomagnetic storm, an E3 pulse can produce geomagnetically induced currents in long electrical conductors, which can then damage or destroy components such as power line transformers. The E3 induced currents are often called quasi-DC currents because by their time domain properties they resemble extremely low frequency waveforms (ultra-long wavelengths) inducing DC-like currents into the long power transmission lines. Nearly all of the damage from E3 in modern systems occurs to the AC power grid, which is generally not designed to handle direct currents, especially in critical devices such as high voltage power transformers which are ubiquitous and essential components in AC power distribution systems (very expensive and with a long lead time for purchase).

Figure 8:
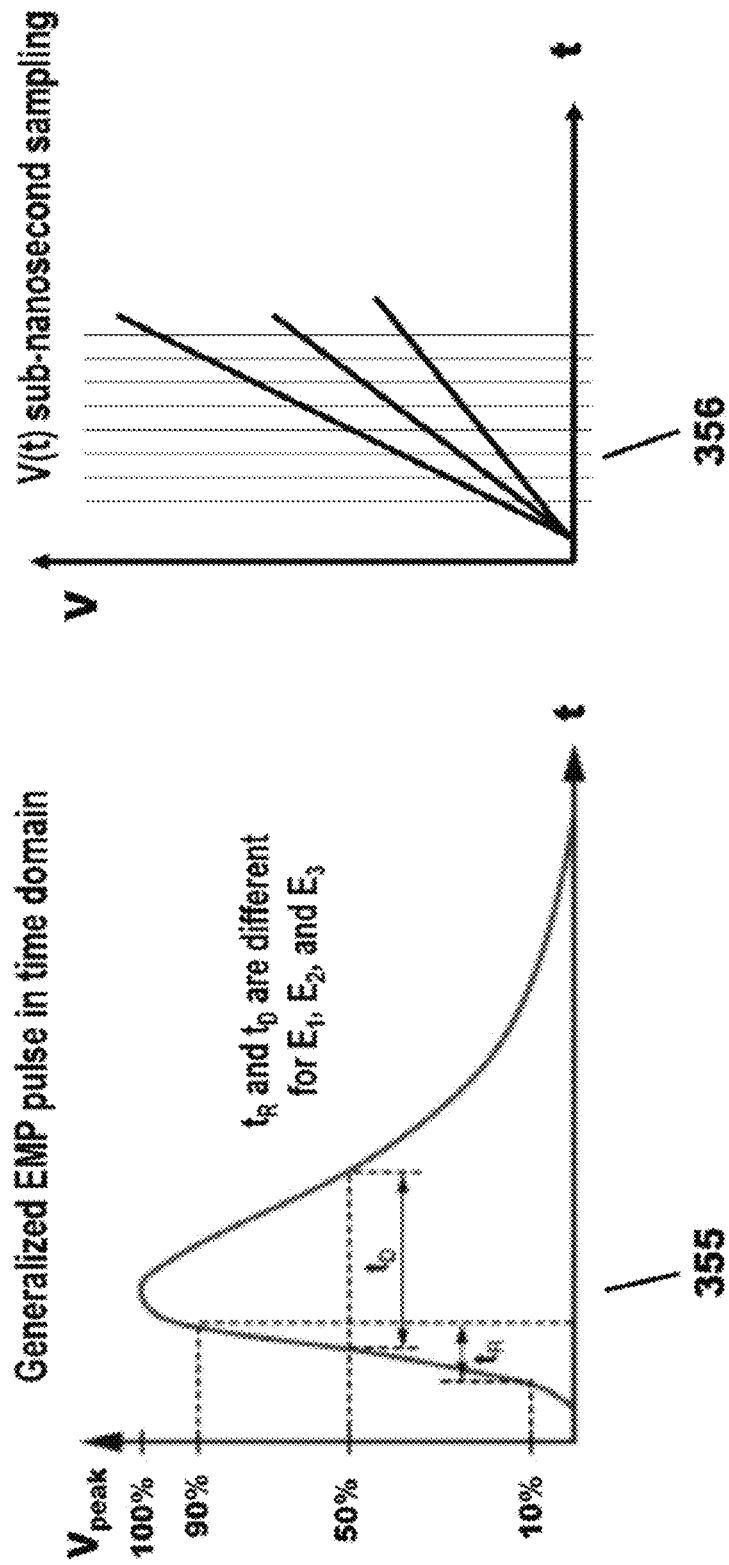
FIG. 8 is a graphical diagram representation of a normalized EMP (left-side diagram) in time domain and the formation of V(t) representation vector with sub-nanosecond sampling of signal waveforms with different rise times (right-side diagram).

Now, looking to Table 1 and 2 in FIG. 21, and also FIG. 8, a successful detection of E1 HEMP has to happen as fast as possible in near real time in order to trigger a response command for protection from the following E2 and E3 phases. Additionally, the detection has to be accurate and with very high level of confidence. A false negative (miss to detect) and a false positive (false detection) are both very expensive propositions.

Some limiting constraints in the process of E1 HEMP detection require additional considerations:
  The HEMP waveforms are described with models which provide adequate time and frequency domain characterization but also have deficiencies: derivative discontinuity, extension to t=∞, an infinite number of poles in the frequency domain
  Using the models to simulate the HEMP waveforms has to be carried out carefully in order to develop a causal system for detection of the event
  The actual HEMP data are not available or extremely limited and minimal information of the recording techniques
  Generating test signals based on the defined waveforms in the related HEMP standards and used for direct injection and radiation testing are very useful but nevertheless only close approximation of the real event
  Many variables influence the actual waveforms of real events introducing uncertainties which have to be accounted for in robust and accurate detection algorithms
  Additional aspects have to be addressed: waveform direction and polarization, 3D space parameters, source distance, geolocation, local geomagnetic lines and surface conductivity, and others Some advantages in development of causal and accurate HEMP detection system are:
  The HEMP associated events have the characteristics of causal signals
  Modern technologies provide comprehensive tools for signal generation and capture, modeling and simulation, algorithms development, implementation, and testing
  Current advancement in ML and AI have provided the means for pattern recognition and classification using data with inherited degree of variability (uncertainty)
  Methods have been developed to compensate the deficiency of available data by using adequate models for synthetic data generation with added randomness and fuzziness in order to expand the pool of training data sets
  The speed of electronic processing devices continues to increase including hardware developed for algorithms implementation for accelerated execution (FPGA, eFPGA, in memory processing, etc.) which offer the capability for superfast deterministic execution of algorithms Existing arbitrary waveform generators, amplifiers, and systems for direct injection and radiation coupling can be used to produce signals for training and performance evaluation. Systems developed for IEMI with ability to controlled waveform parameters can also be utilized.

Figure 1:
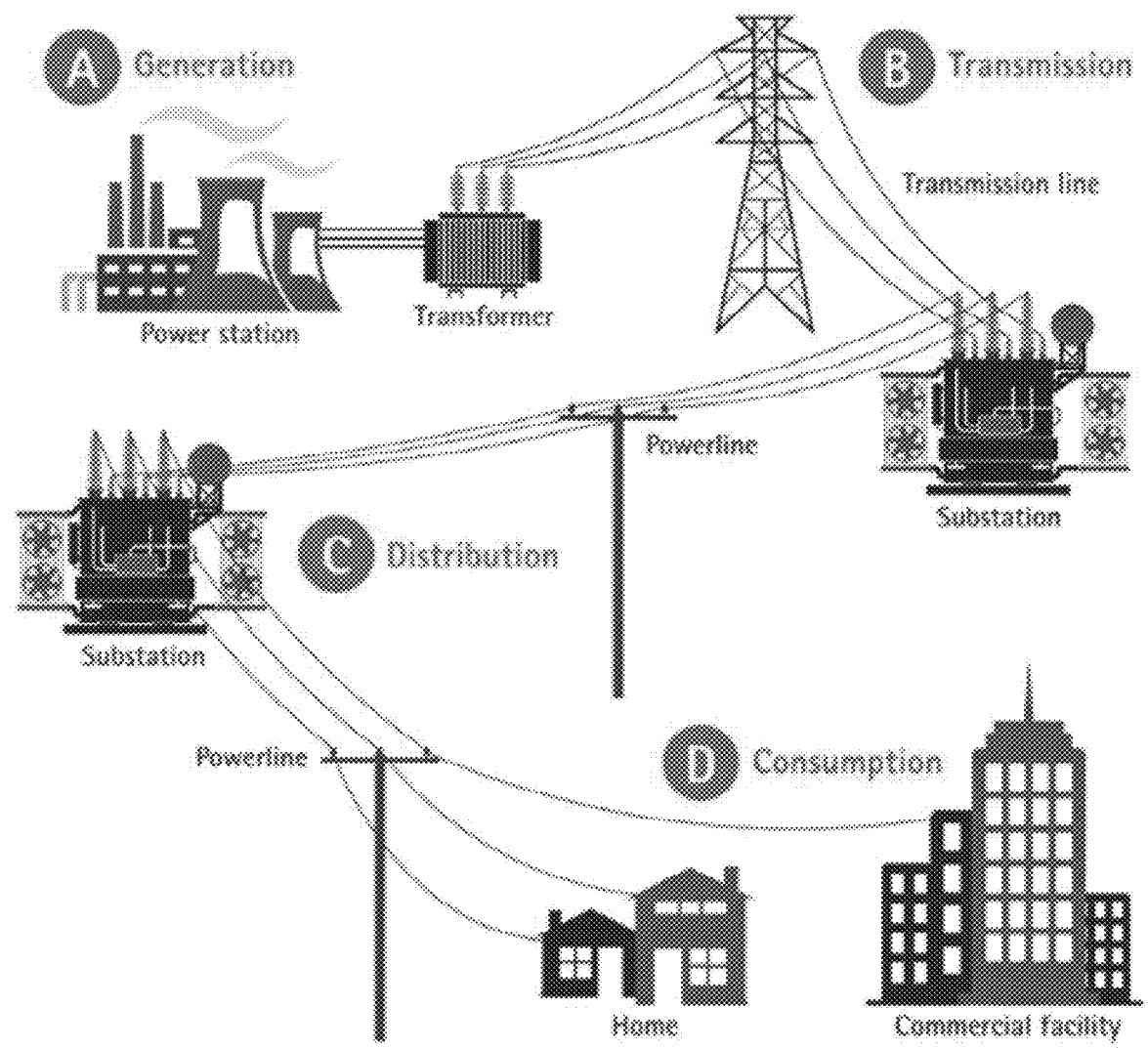
FIG. 1 is a view diagram of an electrical grid segment presenting the generation, transmission, distribution, and consumption components which will be part of the infrastructure subject of protection by the present invention.
Figure 2:
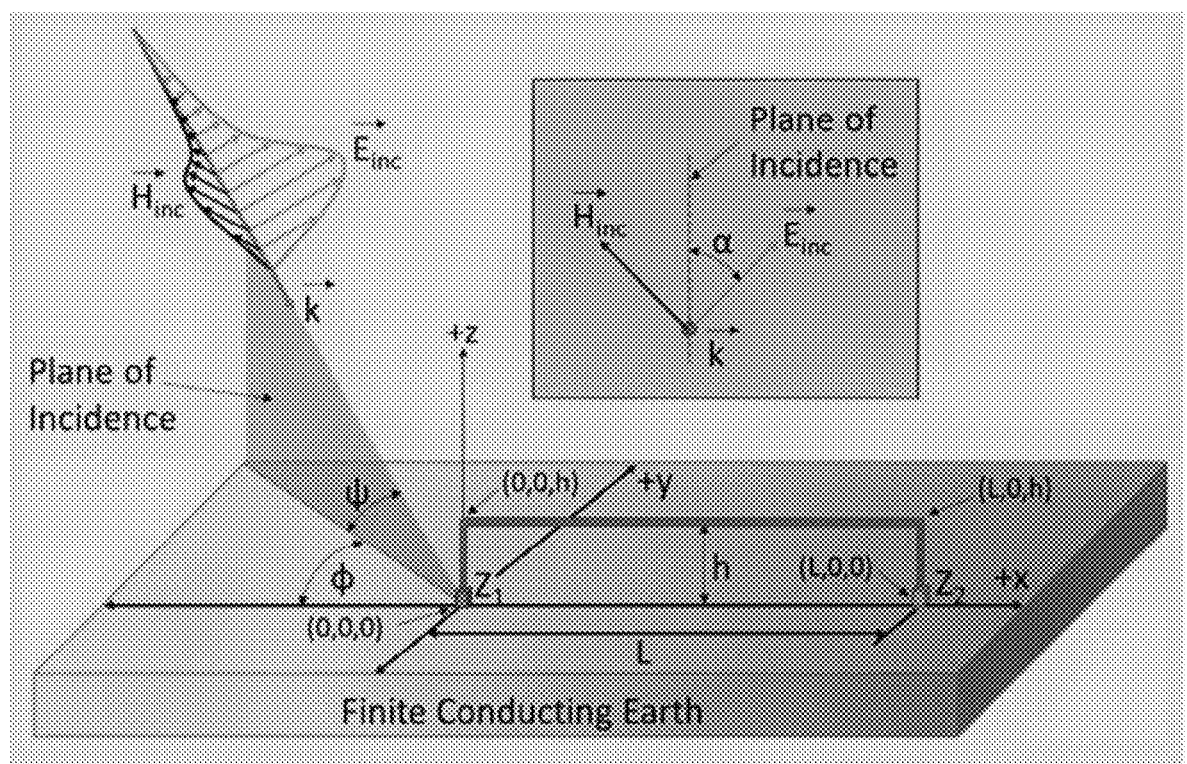
FIG. 2 illustrates the EM wave and its E (electric) and H (magnetic) vectors in the plane of incidence at a transmission wire at height h. The three associated angles ($\alpha$, $\phi$, and $\psi$) are indicative for the importance of 3D monitoring and evaluation of the Electromagnetic field (EMF)
Figure 28:
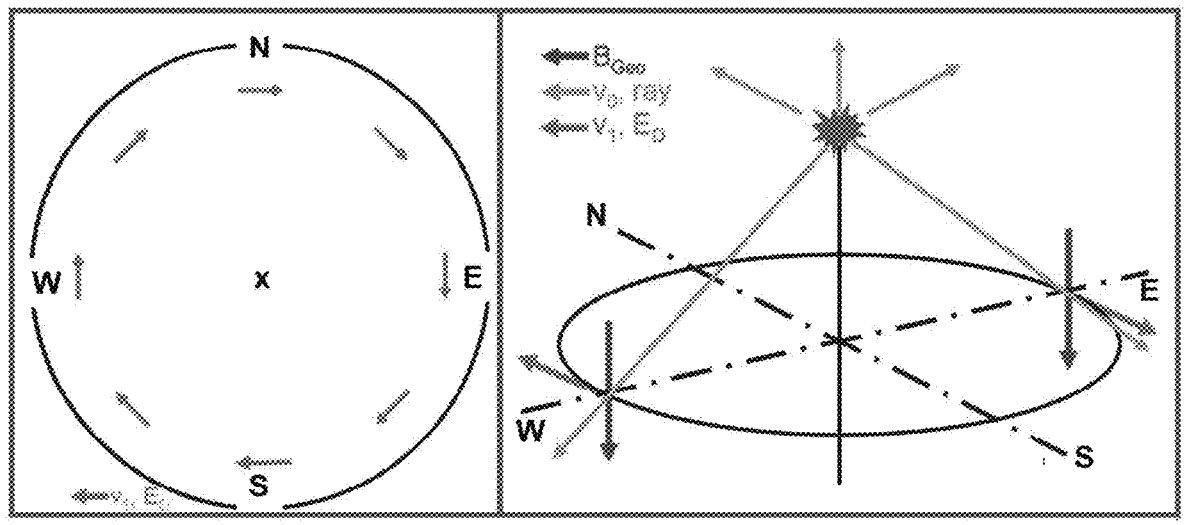
FIG. 28 is an example illustration for the electrical field vector E and its different directions depending on the location of the observer with respect to the HEMP source location.
Figure 29:
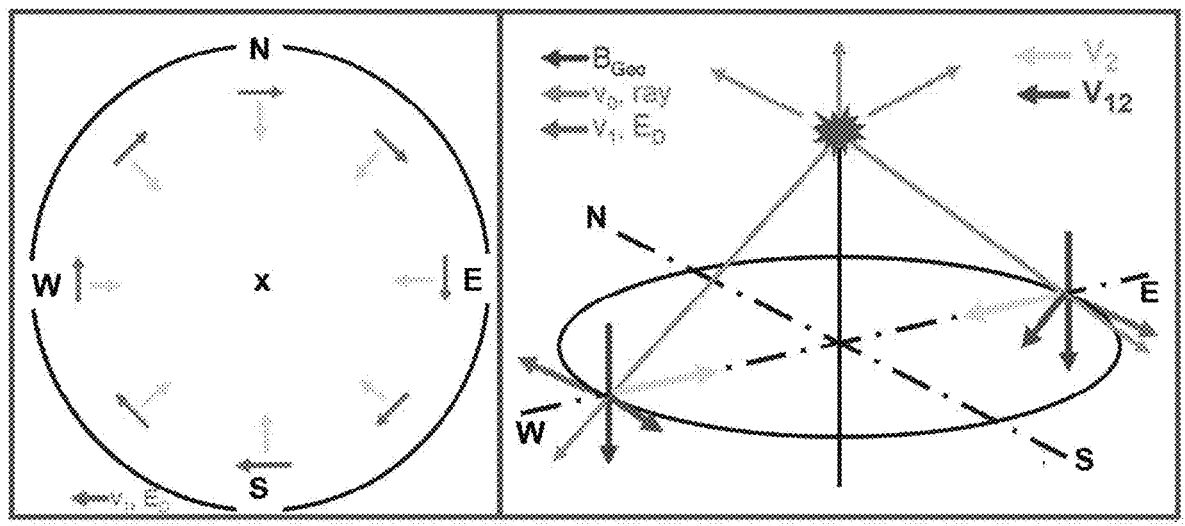
FIG. 29 is an illustration of the complex physical phenomena (adding a quadrupole term of the electrons' velocity) due to the motion of the Compton electrons from high-altitude towards the Earth's surface.

Looking to FIG. 2, an instance of EMP wave is presented including the special three-dimensional coordinates with respect to source and observer. The figure includes the main components that can be used to model, calculate, and simulate the interactions of the EMP with the target of interest, which is a segment of an electrical transmission line with a length L at h height above a finite conducting ground surface and terminated at bought ends with impedances $Z_1$ and $Z_2$. While the pictograph can be used for calculations, in has to be complemented with additional factors, as illustrated in FIG. 28 and FIG. 29. In FIG. 28, the electrical field vector E (magenta color) has different directions depending on the location of the observer with respect to the HEMP source location. For simplicity of the illustration, the Geomagnetic field $B_{Geo}$ is assumed to be vertical and homogeneous. As noted above, even under the ideal assumption of a dipole Geomagnetic field, there are variation of the B field along the ray path. Assume a uniform Geomagnetic field is equivalent to assuming the Earth radius is very large, or the burst height is very low. With the uniform vertical Geomagnetic field, the azimuthal E field has a cylindrical symmetry, as shown in FIG. 28. The E1 HEMP dipole E field is only horizontal, and tangent to the circle shown.

However, in reality, the conditions are more complex due to the motion of the Compton electrons. The additional vector of the electrons' velocity adds a quadrupole term, as shown in FIG. 29.

In the FIG. 29, this is indicated by the full $V_2$ term (light orange), and the perpendicular (transverse) part $V_{12}$ (dark orange). This is for the same case as in FIG. 28, but with the quadrupole term now added. This term (orange) is radial, and also has cylindrical symmetry. For this perfectly vertical $B_{Geo}$ case, all terms and vector components (including the total field) have east-west symmetry in amplitude. Further details of the EMP physical phenomena are beyond the scope of this applications and can be found elsewhere. FIG. 28 and FIG. 29 are included to emphasize the importance of using 3D sensors, with three individual sensors positioned on three mutually orthogonal axes, as describe previously.

Figure 3:
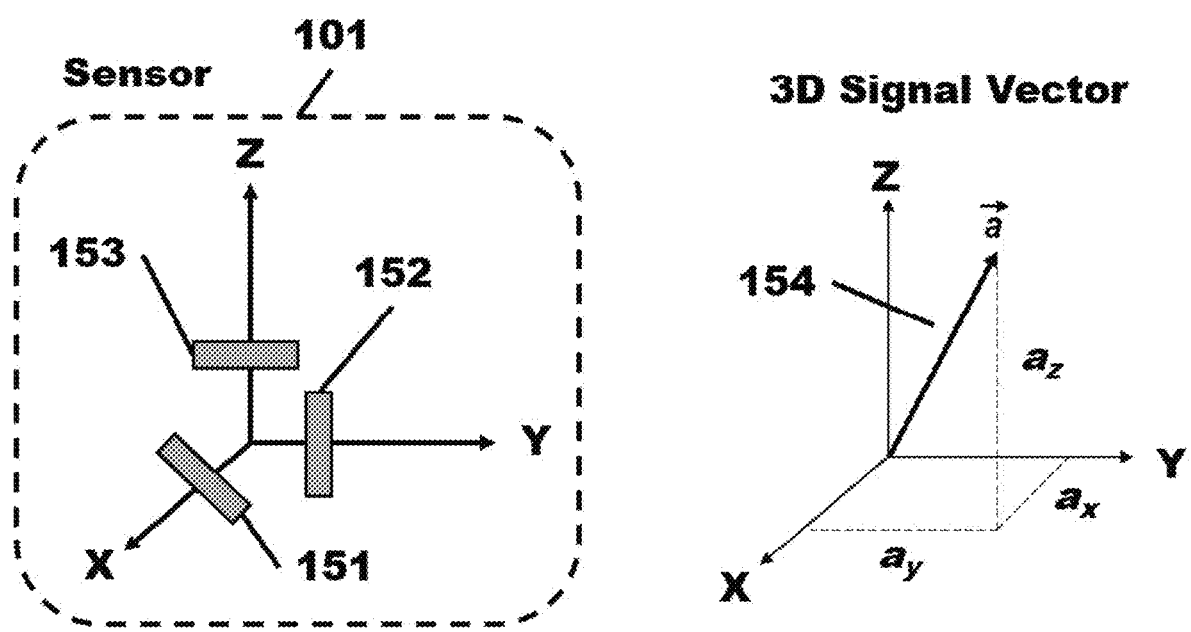
FIG. 3 is an example diagram illustrating the three-dimensional orthogonal configuration of one of the multiple sensors referred to in the present invention. On the left side (FIG. 7B, left), the three orthogonal axes are used to illustrate the placement of three sensors. The signals from the sensors form the single vector α of the EMF based on its $α_x$, $α_y$, and $α_z$ orthogonal components (FIG. 7B, right)

Looking to FIG. 3, an example of a 3D sensor 101 is presented on the left, constructed with three individual sensors 151, 152, and 153. Each individual sensor is mounted on a dedicated axis mutually orthogonal to the axes of the other sensors to form a combined field vector 154 with respectively X, Y, and Z components $\alpha_x$, $\alpha_y$, and $\alpha_z$ for the three orthogonal axes.

Figure 4:
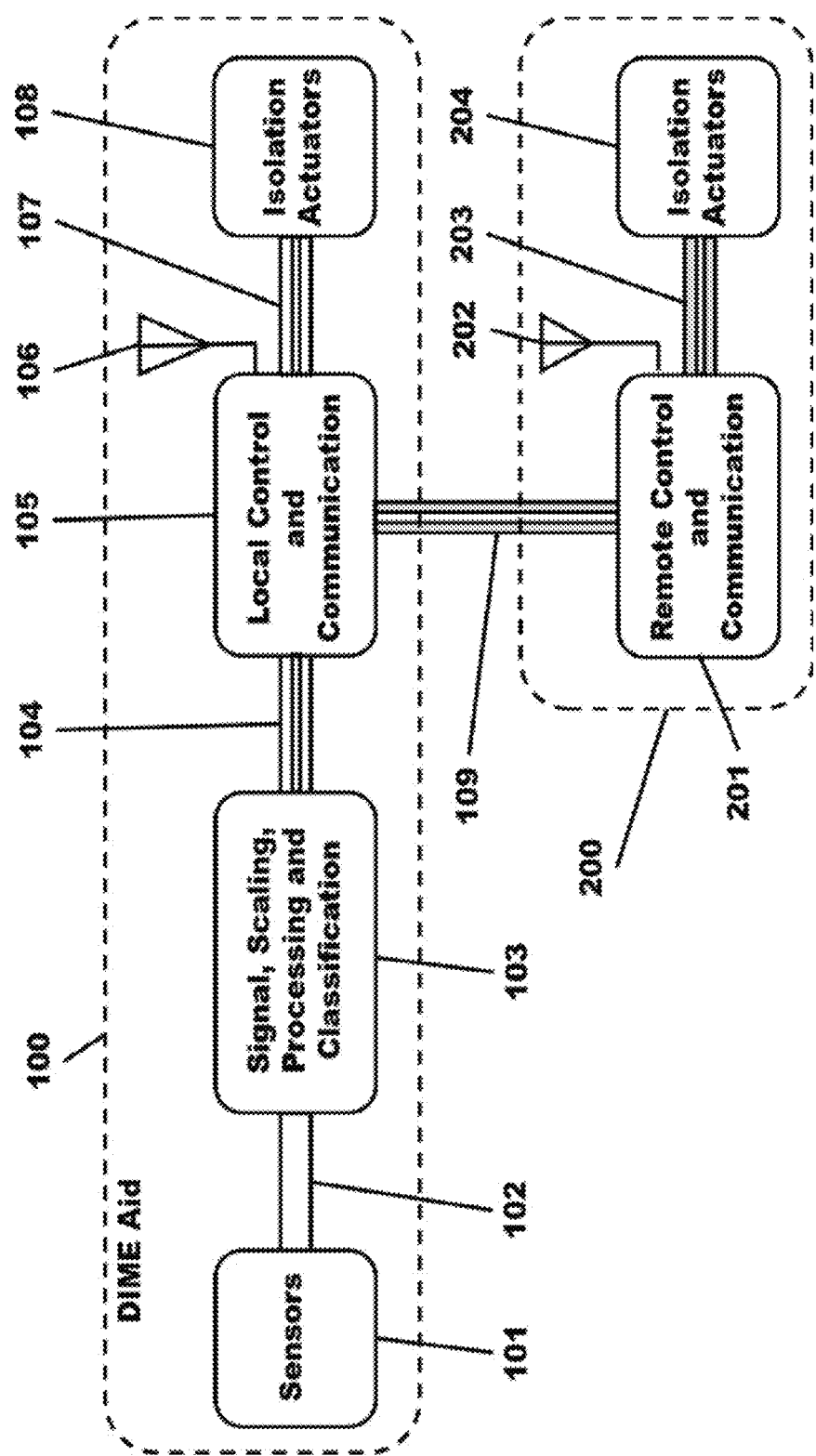
FIG. 4 is a block diagram illustrating the architectural configuration of the DIME Aid modules with labels of their functionalities according to the present invention.

Looking to FIG. 4, a block-diagram of the DIME Aid 100 includes the use of plurality of 3D sensors 101 connected via shielded, protected physical layer 102 to the module for Signal conditioning, scaling, processing, and classification 103. The classification results are communicated to the Local Control and Communication (LCC) module 105 via fiber link. The same link is used for transfer of data to a remote location. The LCC has two additional fiber optic links 107 and 109 and a wireless communication channel utilizing the antenna 106 which is surge-protected and normally electromechanically disconnected. The combination of fiberoptic and wireless links depend on the specific application. The communication may include standard or custom protocols for data security and integrity protection. The command to the local Isolation actuator 108 is sent vis fiber link 107. Different technics for command conformation and verification may be used to prevent false triggering of the actuator. The communication with a remote location 200 is provided with the fiber link 109 and/or the wireless link based on antenna 202. The Remote Control and Communication (RCC) module 201 receives and transmits commands and data via the fiber link 109 and the antenna 202. When the fiber link 109 is present, it is the preferred physical layer for communication due to its EMP immunity. The antenna 202 remains electrically disconnected until it is needed for communication and its associated transceiver is surge protected.

Only a wireless channel may be practical in certain applications in which case the antenna is continuously connected to its transceiver and enhanced surge protection needs to be in place. In such scenarios, it is preferable to use directional antennas to limit the unwanted EMP coupling. It is to be noted that the block-diagram illustrates a single peer-to-peer communication using 105 and 201. In practical applications, LCC 105 could be broadcasting to multiple RCCs 201. There are no specific limitations on the antenna types, modulation, and the frequency band. However, published prior art suggests that the 3 MHz to 30 MHz frequency range has specific advantages during a HEMP event.

The RCC module controls the Isolation actuator 204 via the fiber link 203. The details of possible implementation of Isolation Actuators 108 and 204 are described in the prior art.

Figure 5:
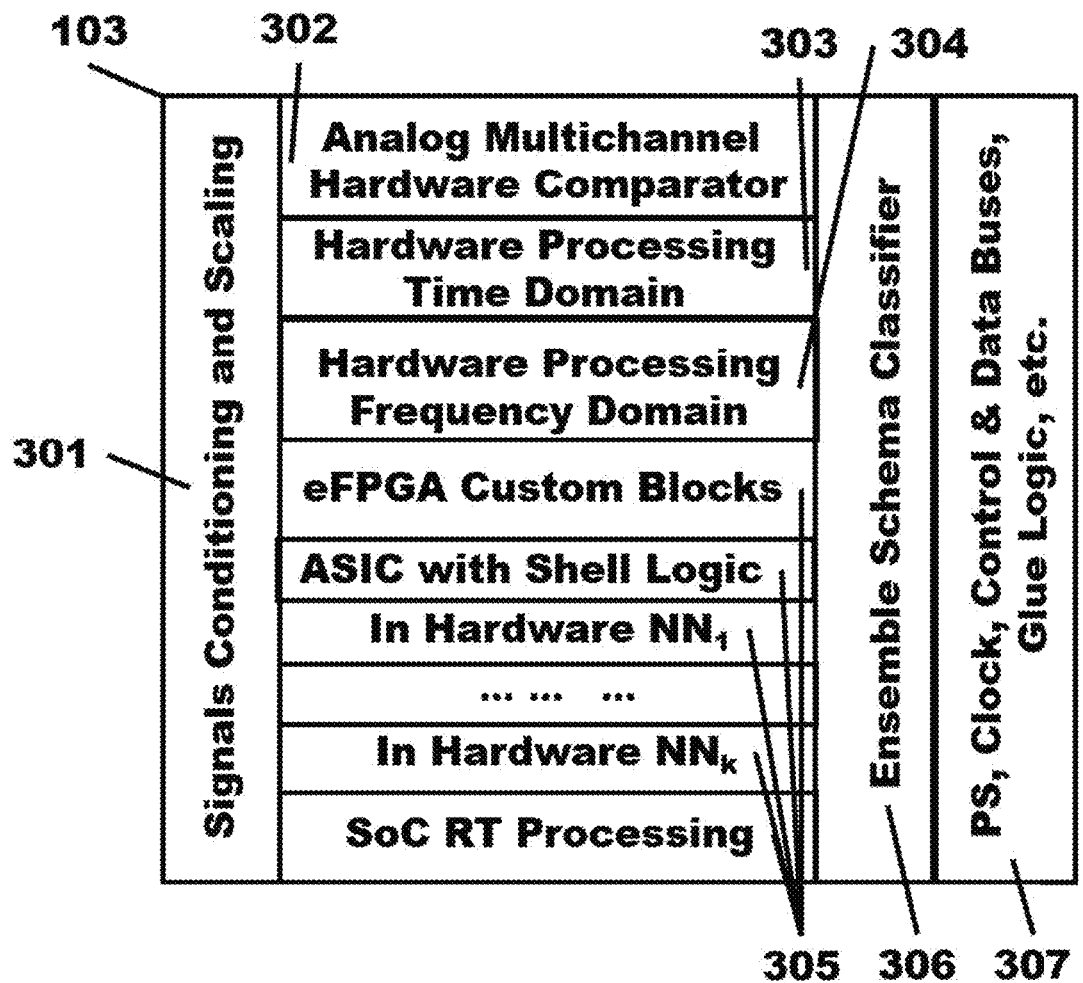
FIG. 5 is a block diagram of an exemplary implementation of submodule of the DIME Aid for Signal Pre-processing (conditioning, scaling, etc.), Evaluation, Detection, and Classification. The module includes the necessary supporting submodules: power supply, clock, control and data busses, memory, and others.

Looking to FIG. 5, the block diagram of the Signal conditioning, scaling, processing, and classification (SCSPC) 103 of the DIME Aid is presented. As the name suggests, the Signal Conditioning and Scaling 301 conditions and scales the signals coming from the plurality of sensors and has as many channels as needed from the given embodiment. The Processing sections of the SCSPC is illustrated with an example that includes a combination of hardware implementation of signal processing units such as Multichannel comparator 302, Time domain processing unit 303, Frequency domain processing unit 304, and plurality of hardware blocks with implemented algorithms 305. The exemplary 305 in FIG. 5 shows a hardware implemented NNs, embedded FPGA custom blocks, a System on a Chip for real time processing, and an Application Specific Integrated Circuit. The Classification section of the submodule 106 is presented with an example of an Ensemble Schema Classifier which, as described previously includes algorithmic implementation to improve the accuracy and the confidence of detection and classification. The SCSPC submodule 103 also includes the necessary supporting components 307, which include without limitations, a power supply, a clock or clocks, control and data busses, a specialized memory and a general-use memory, a control and coordination microprocessor (glue logic), and others.

Figure 6:
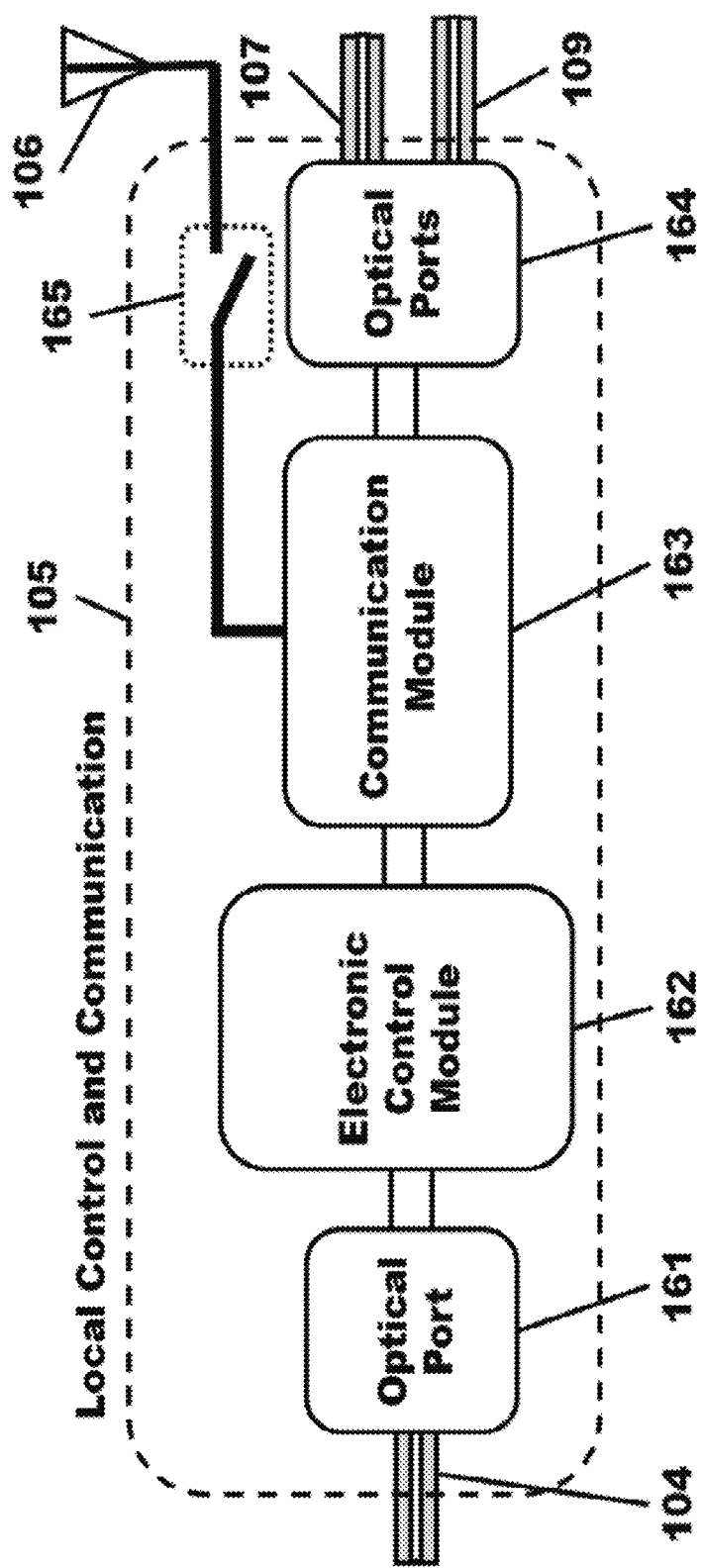
FIG. 6 is a block diagram of an exemplary Local Control and Communication module of the DIME Aid system.

Looking to FIG. 6, the block-diagram of an exemplary Local Control and Communication module of the DIME Aid system is presented, including an input Optical port 161, an Electronic control module 162, a Communication module 163, output Optical ports 107 and 109, an antenna element 106, and an electromechanical switch 165.

Figure 7:
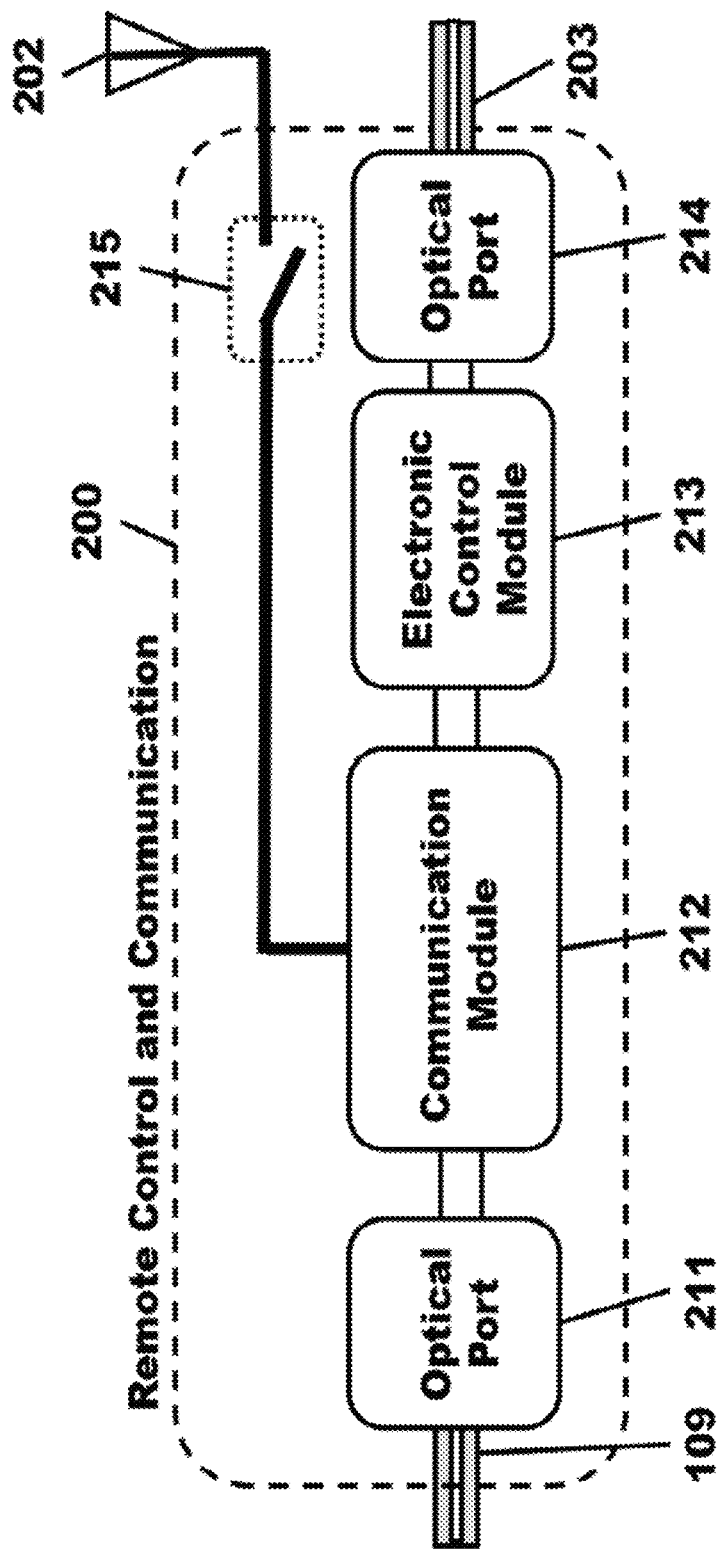
FIG. 7 is a block diagram of an exemplary Remote Control and Communication module of the DIME Aid system.

Looking to FIG. 7, the block-diagram of an exemplary Remote Control and Communication module of the DIME Aid system is presented, including an input Optical port 109, a Communication module 212, an Electronic control module 213, output Optical port 203, an antenna element 202, and an electromechanical switch 215.

Looking to FIG. 8, an exemplary graphical representation 305 of a normalized EMP in time domain (left-side diagram in FIG. 8) and the formation of V(t) vector representation 355 with sub-nanosecond sampling of signal waveforms with different rise times (right-side diagram in FIG. 8).

Figure 9:
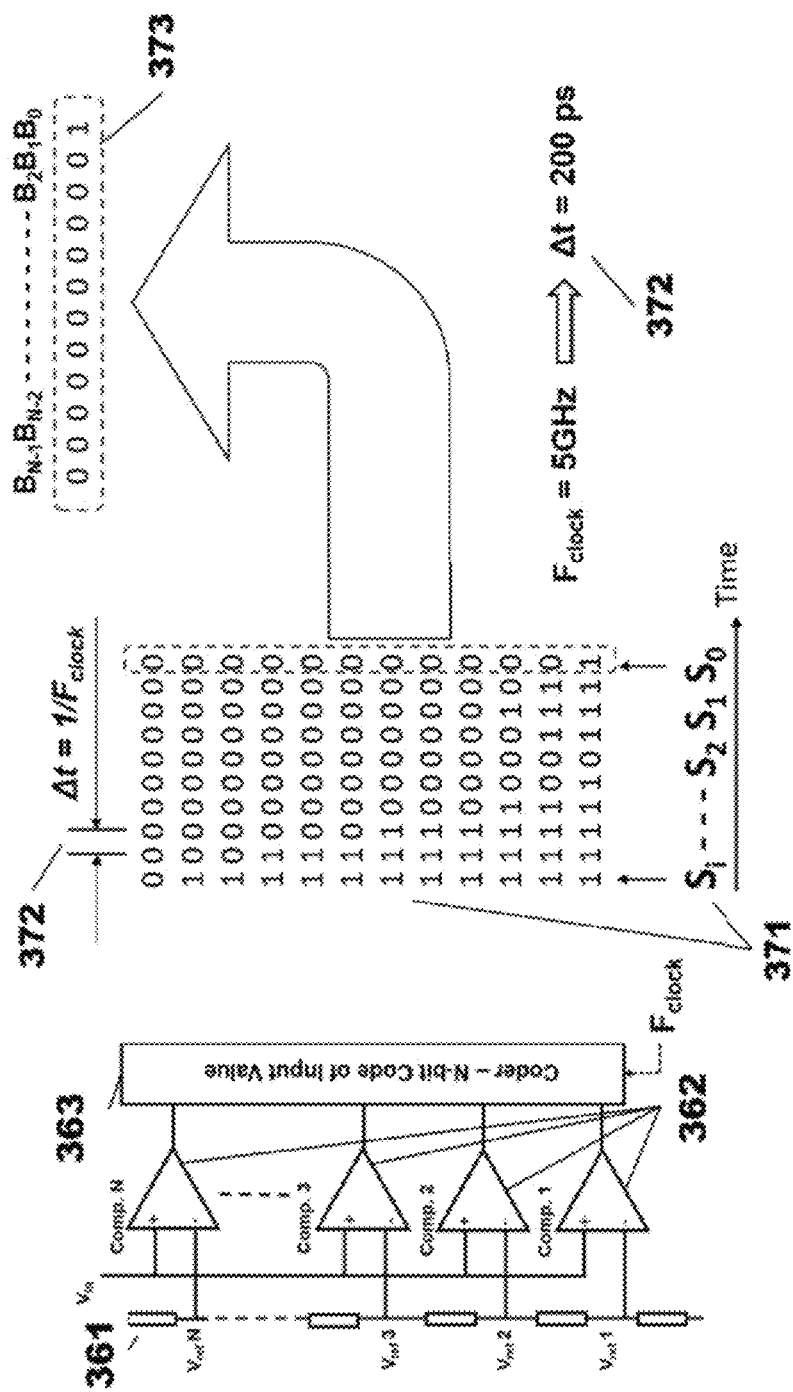
FIG. 9 is an exemplary graphical representation of an Autoencoder Network with Multichannel single-bit comparators, Clock, Shift registers, and Output register to a trained NN for coding and classification of an EMP signal represented as a time series V(t).

Looking to FIG. 9, it is an exemplary graphical representation of the front end of an Autoencoder Network. The block-diagram includes an input Voltage divider 361 with Multichannel single-bit comparators 362, a Clock signal with picoseconds resolution 372, Shift registers 371, and Output register 373 to the input of an external block with a hardware implemented trained NN for coding and classification of an EMP signal represented as a time series V(t) which is presented to the input Voltage divider 361.

Figure 10:
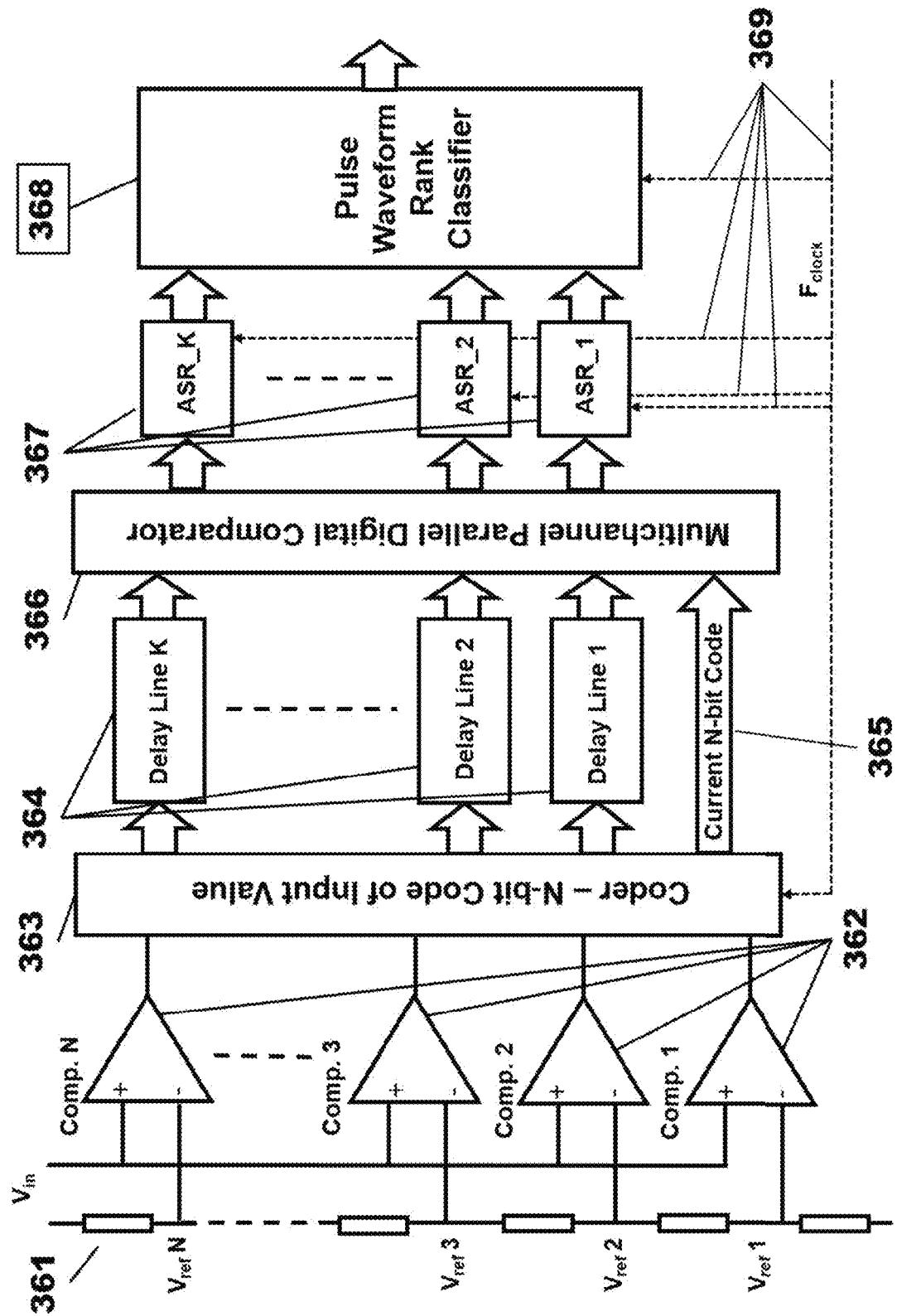
FIG. 10 is an exemplary graphical representation of an Autoencoder Neural Network trained for coding and classification of an EMP sensor time series vector V(t) represented with Multichannel comparators, N-bit Coder, Delay lines, Multichannel Parallel Digital Comparator, multiple ASR blocks, and Pulse Waveform Rank Classifier.

Looking in FIG. 10, it is an exemplary graphical representation of an extended Autoencoder Neural Network trained for coding and classification of an EMP sensor time series of a field vector V(t). The block-diagram includes an input Voltage divider 361 with Multichannel single-bit comparators 362, an N-bit Coder 363, a plurality of K Delay lines 364, a Multichannel parallel digital comparator with K lines, a plurality of K Auto-code Synchronous Registers 367, a Clock signal with picoseconds resolution 369, and Pulse Waveform Rank Classifier 368 for the coded representation of an EMP signal of a time series vector V(t) which is presented to the input Voltage divider 361.

Looking it FIG. 11, it is an exemplary illustration for the fast, in memory processing of a sensor signal with coding and classification of an EMP represented as consecutive time series $S_i$ 371 of the signals from three X, Y, and Z sensors places on three orthogonal axes. The N-bit binary code representations 373 are used for rapid, in memory calculation of time domain characterization: rise time, peak amplitude value, slew rate, pulse width at half maximum. The example in FIG. 11 illustrate the calculation using the clock period $\Delta t$ and the voltage divider constant $\Delta V$.

Figure 12:
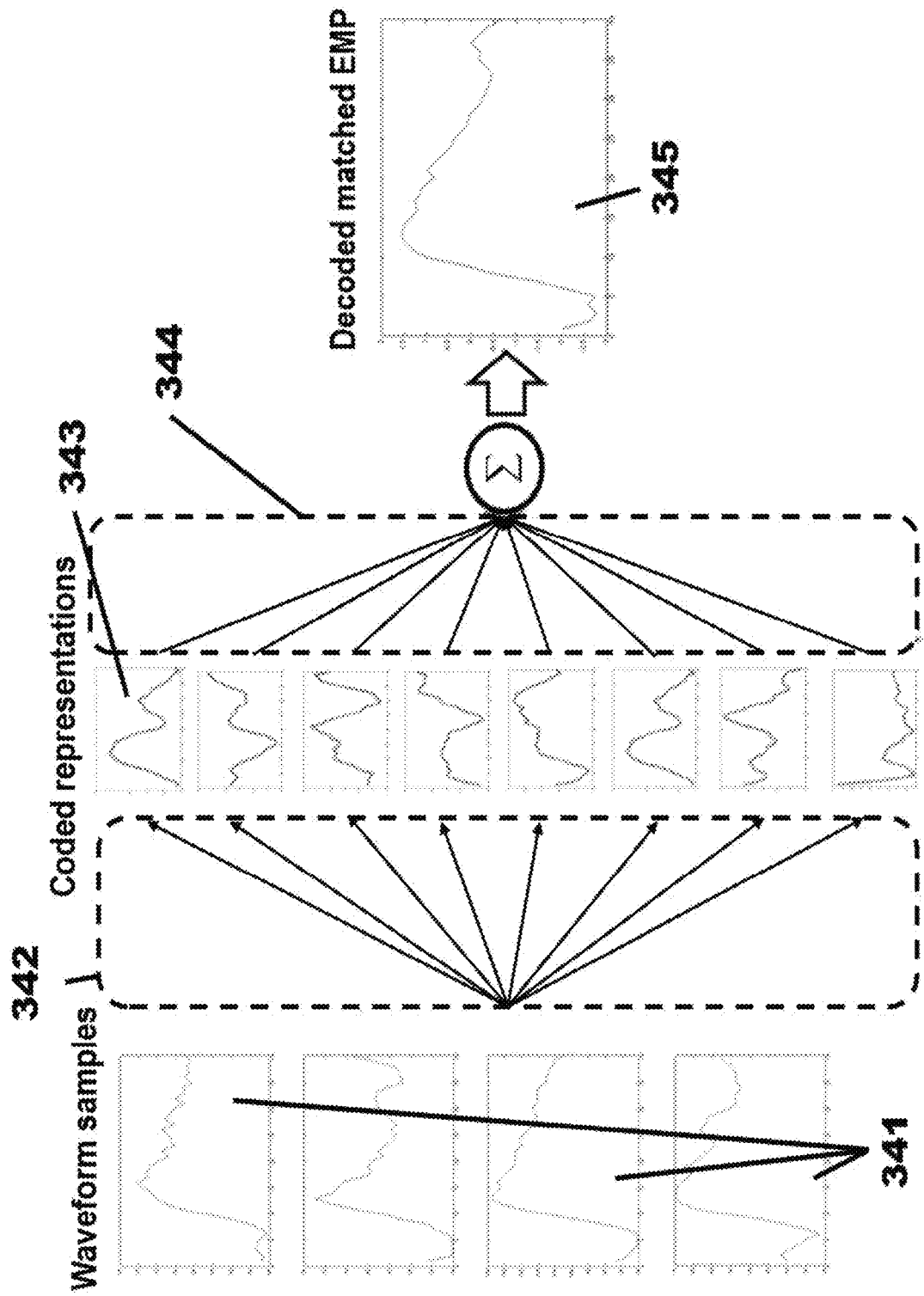
FIG. 12 is an exemplary presentation of the plurality of waveforms used for training of the NNs, their codded representation and decoded matched EMP waveform class.

Looking in FIG. 12, the block-diagram of an exemplary EMP Waveform classifier is presented. It includes a plurality of input waveforms 341, which the Coder 342 represents using a sparse coding algorithm to form the reduced length Code representations 343, which are classified by a trained NNs 344, to generate an output of the decoded (matched) EMP waveform class 345 (when present).

Figure 13:
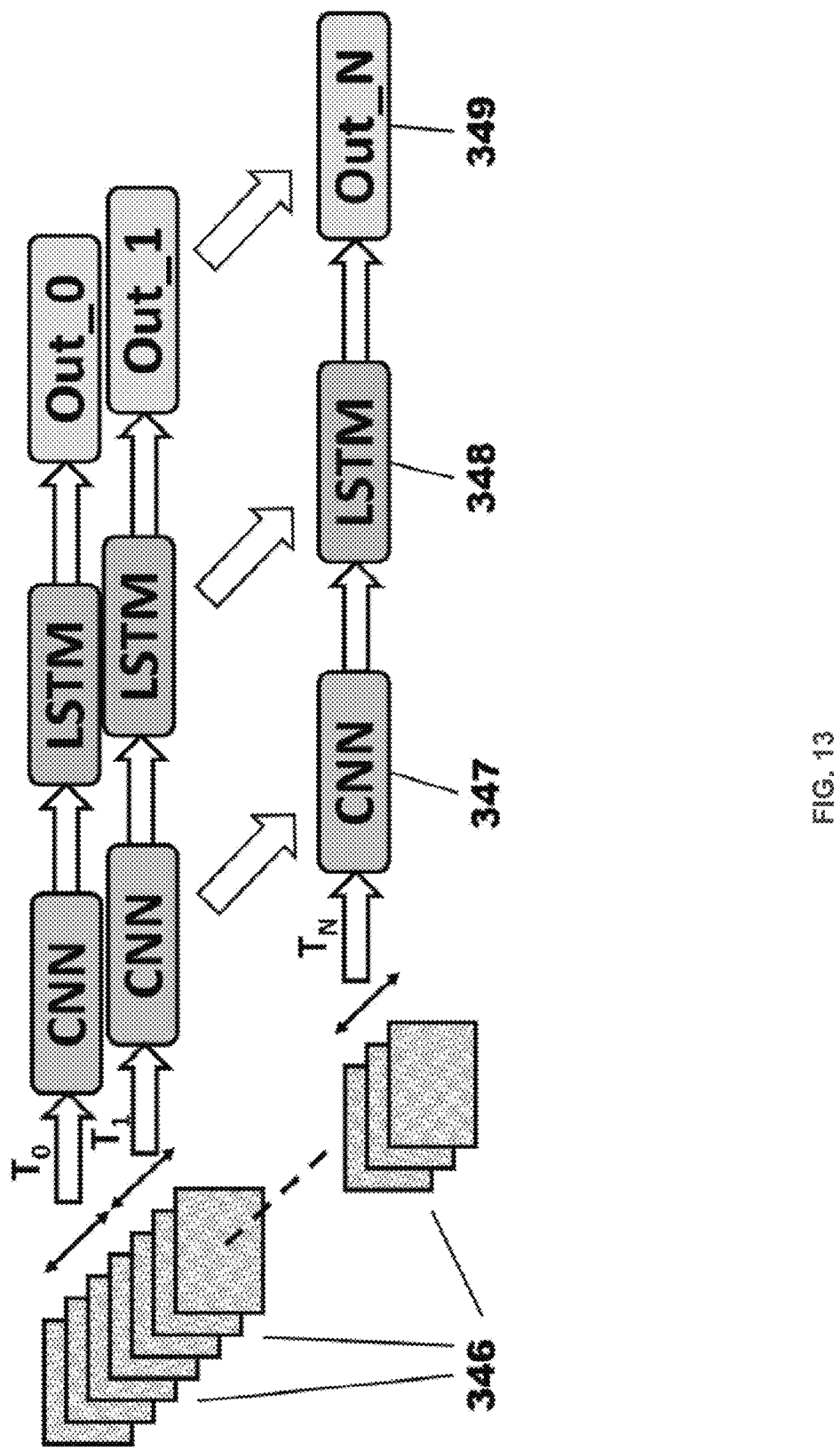
FIG. 13 is an exemplary illustration of EMP monitoring in instant time frames ($t_0, t_1, t_3, \ldots, t_{n-1}, t_n$) and detection using combination of Convolutional NN with a Long-Short time Memory Neural Network (LSTM).

Looking in FIG. 13, the block diagram of an exemplary monitoring of time series sensor signals converted to images 346 in instant time frames ($t_0$, $t_1$, $t_3$, . . . , $t_{n-1}$, $t_n$) and detection using combination of Convolutional NN (CNN) 347 with a Long-Short time Memory Neural Network (LSTM) 348 to classify the input signal at its output 349.

Figure 14:
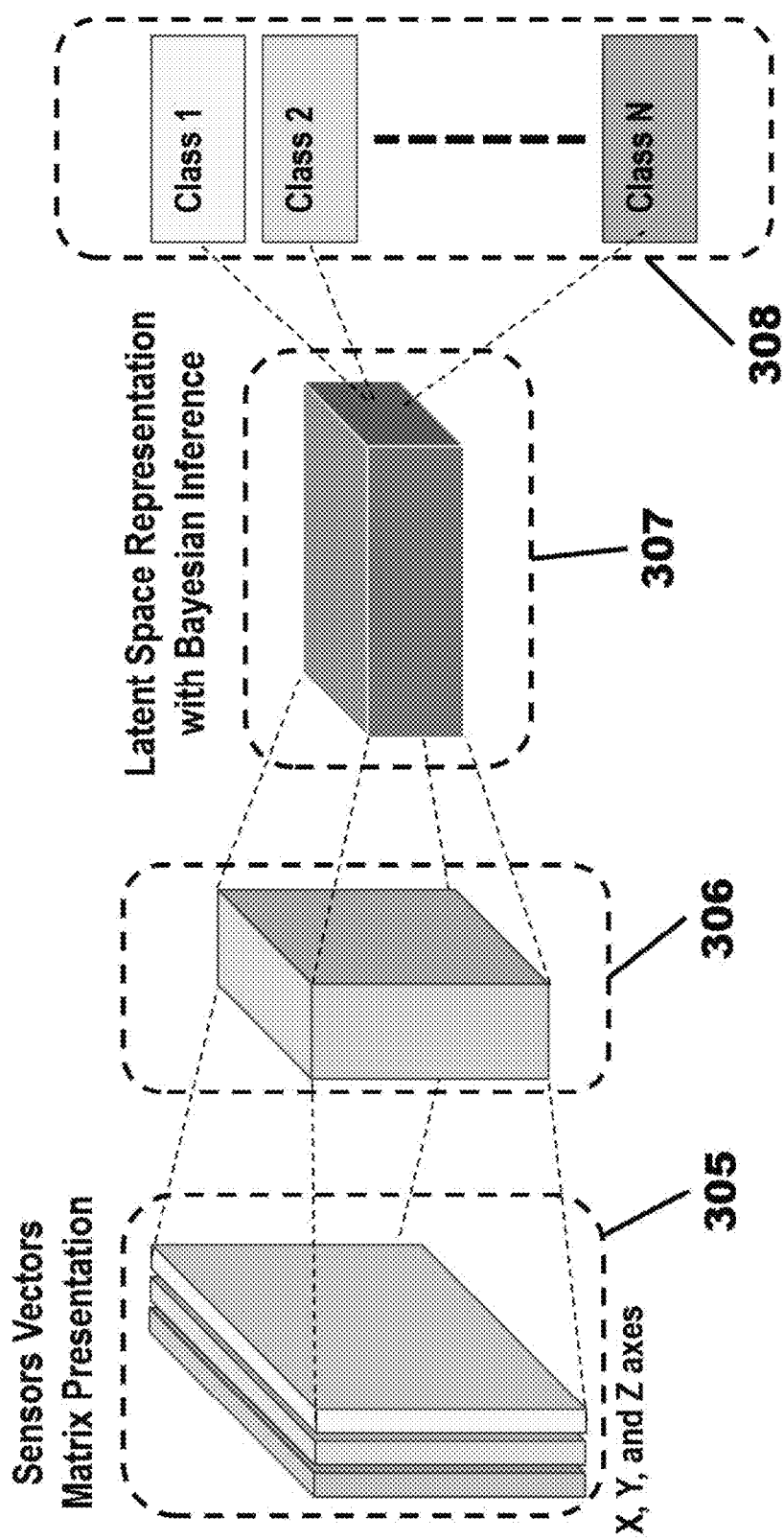
FIG. 14 is an exemplary presentation of combining the sensors' time-series signals vectors V(t) into 2D matrices for simultaneous processing using GPUs and advanced NNs with ML/AI image classification. The signals from the 3D sensors can be viewed and processed as the tree layers of a color RGB image.

Looking in FIG. 14, the block diagram of an exemplary presentation of a modified Variational Autoencoder (VAE) architecture. The sensors' time-series signals vectors V(t) are combined into 2D matrices 305 for simultaneous processing using GPUs and advanced NNs with ML/AI 306 for image classification. The signals from the 3D sensors can be viewed and processed as the tree layers of a color RGB image 305. The Latent space representation 307 incorporates Bayesian inference. The compressed representations are probability distributions used for classification by the classifier 308.

Figure 15:
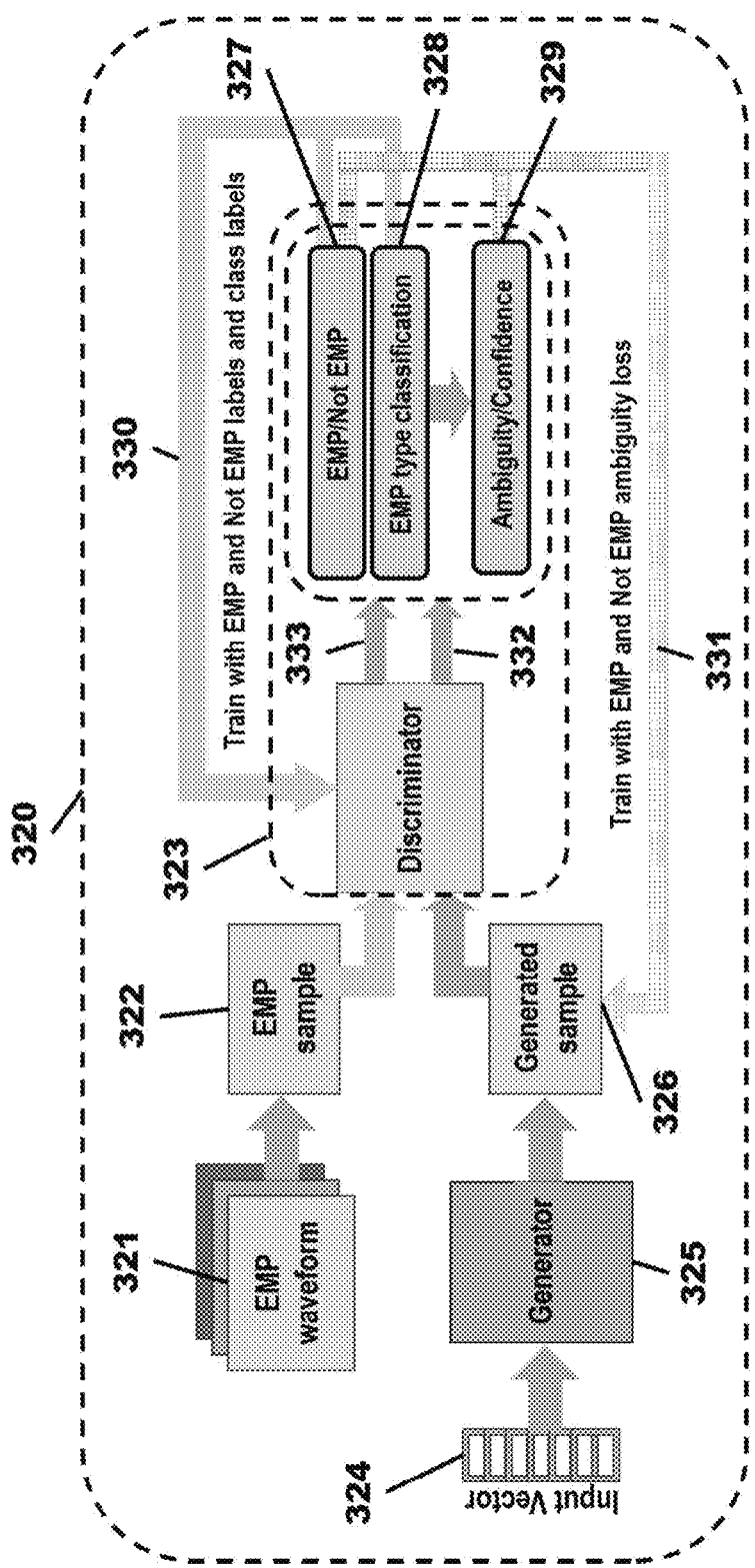
FIG. 15 is an exemplary presentation of a GAN training process with valid EMP waveforms and generated waveforms with random ambiguity.
Figure 16:
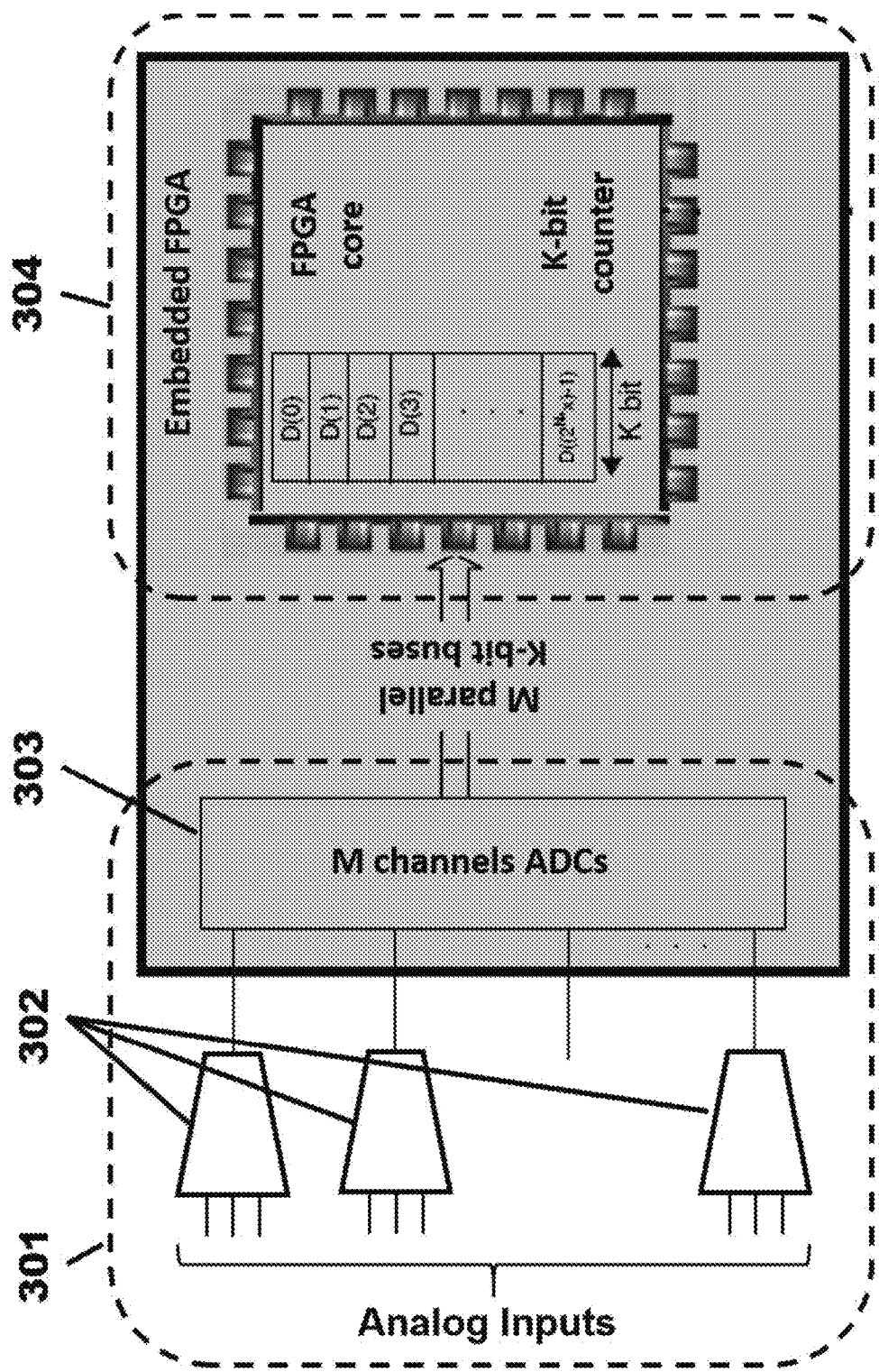
FIG. 16 it is an exemplary graphical representation of an input module and a hardware algorithm implementation of a Neural Network using and an embedded FPGA for simultaneous classification of multiple sensor signals represented as a time series V(t) analog inputs.
Figure 17:
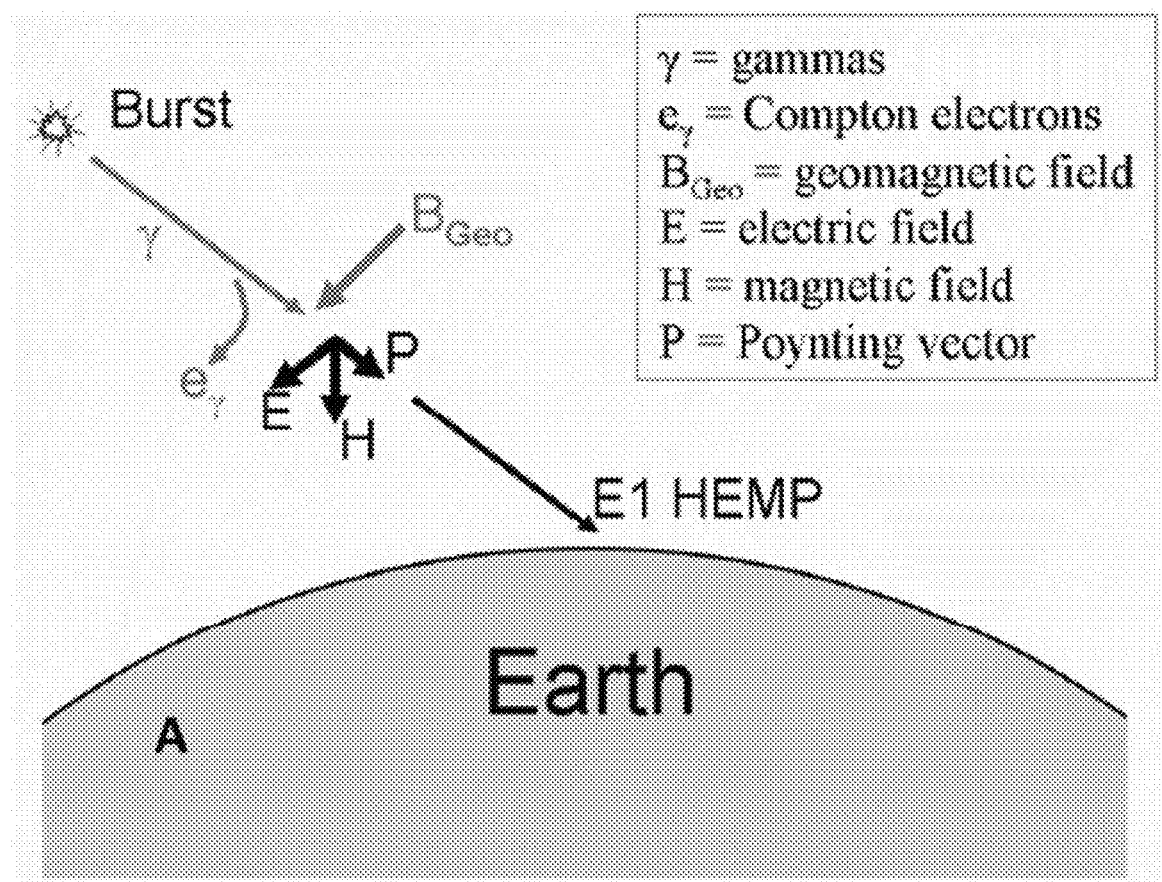
FIG. 17 is a pictogram representation of the physical phenomena associated with the formation of the initial phase E1 from a high-altitude EMP (E1 HEM) as a result of interaction of the gamma rays produces electrons with the Geo-magnetic field.
Figure 18:
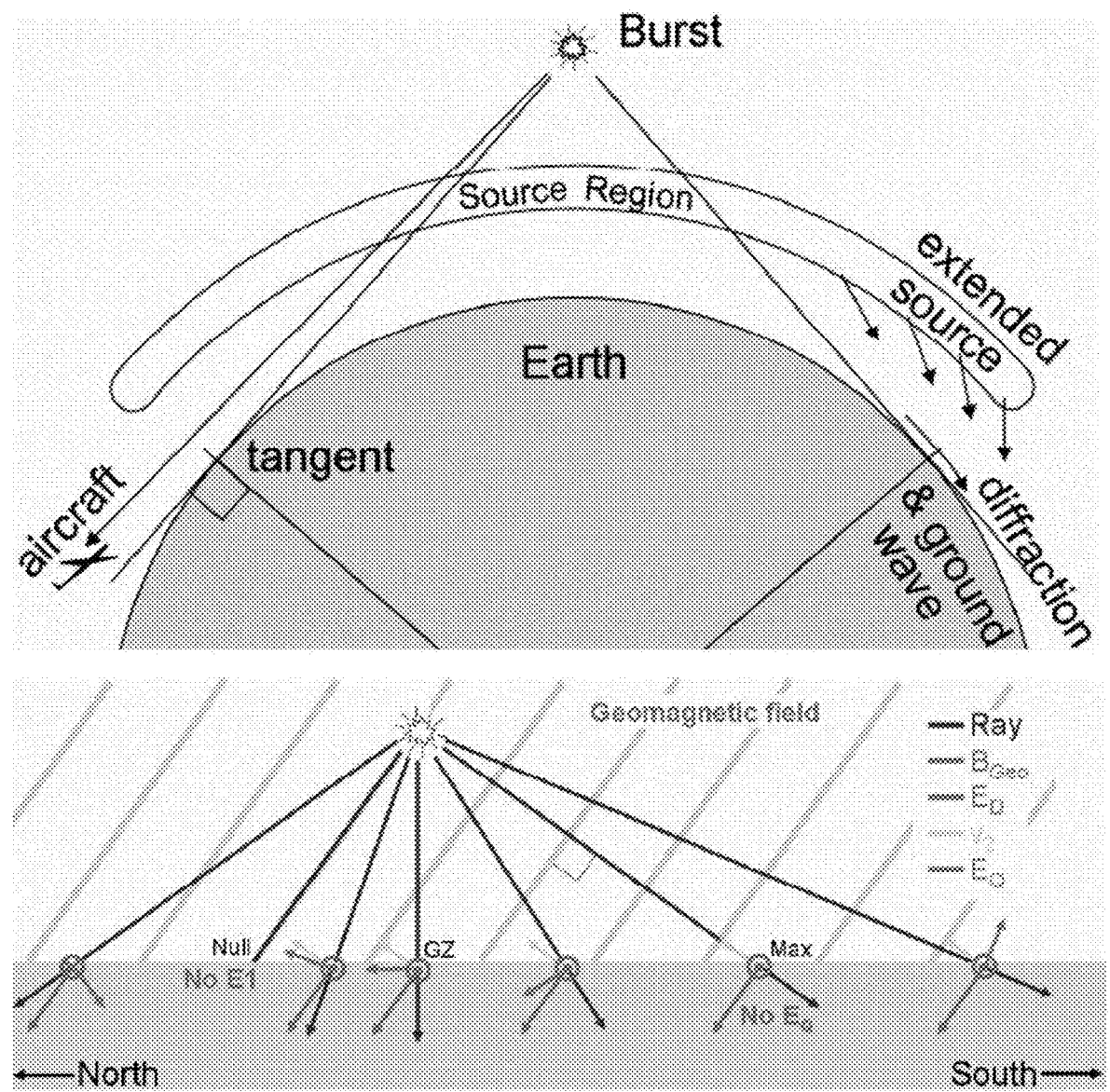
FIG. 18 is an illustration of the spatial scale of a HEMP (effect surface coverage) and the dependence of the intensity of the generated electromagnetic field on the Geolocation of the high-altitude nuclear explosion with respect to the orientation of the Geomagnetic field.

Looking in FIG. 15, it is an exemplary block-diagram presentation of a Generative Adversarial NN (GAN) 320. The GAN has a Generator 325 and a Discriminator 323. Both the Generator 325 and the Discriminator 323 are neural networks. The Discriminator 323 has two inputs and two backpropagation (feedback) flows. The available (real) EMP waveforms 321 are used as samples 322 and presented to the Discriminator 323 input module. The Generator 325 uses input random vectors 324 and learns to generate samples of plausible data 326. The generated instances become negative (nonrealistic) training examples for the Discriminator 323. During training, the Discriminator 323 receives feedback 330 from True/Not true (EMP/Not EMP) module 327 and the EMP type Classifier module 328. The Generated sample is modified with feedback 331 from True/Not true (EMP/Not EMP) module 327 and the Ambiguity and Confidence module 329. Through backpropagation, the Discriminator's classification modules 327, 328, and 329 provide signals that the Generator 325 uses to update its weights and respectively the generated samples. The Discriminator 323 learns to distinguish the Generator's 325 fake data from real EMP waveform data 321. The discriminator penalizes the generator for producing implausible results. When training begins, the Generator 325 produces obviously fake data, and the Discriminator quickly learns training process with valid EMP waveforms and generated waveforms with random ambiguity input vectors. The two outputs of the Discriminator's input module are the Discriminator loss 333 and the Generator loss 332.

After the training, the generative model includes the distribution of the data itself, and it is used to evaluate how likely a given sample is real. The discriminative model ignores the question of whether a given instance is likely, and just tells you how likely an available label (for a pulse waveform in this case) is to apply to the input signal.

Referring now to FIG. 14, it is an exemplary graphical representation of an input module 301 and a hardware algorithm implementation of a Neural Network using and an embedded FPGA 304. The NN is trained for simultaneous classification of multiple sensor signals represented as a time series V(t) analog inputs with front end conditioning modules 302 and converted to digital domain using an M-channel analog to digital conversion (ADC) 303 and transferred simultaneously to the embedded FPGA core 304.

Therefore, it can be seen that the system and method of the present invention are well-suited to detect, isolate, monitor, and alert when respective components of an EMP are detected and, in some embodiments, determining in real time if received sensor signals is indicative of the E1 component includes a hardware implemented neural network (NN) having algorithms for machine learning (ML) and artificial intelligence (AI) operable to provide instantaneous detection and classification.

Many different arrangements and configurations of the system described and depicted, as well as components and features not shown, are possible without departing from the scope of the claims below. Likewise, variations in the order of the steps of the method described, as well as different combinations of steps, are within the scope of the present invention. Embodiments of the technology have been described with the intent to be illustrative rather than restrictive. Alternative embodiments will become apparent to readers of this disclosure after and because of reading it. Alternative means of implementing the aforementioned can be completed without departing from the scope of the claims below. Identification of structures as being configured to perform a particular function in this disclosure and in the claims below is intended to be inclusive of structures and arrangements or designs thereof that are within the scope of this disclosure and readily identifiable by one of skill in the art and that can perform the particular function in a similar way. Certain features and sub-combinations are of utility and may be employed without reference to other features and sub-combinations and are contemplated within the scope of the claims.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described.

It is understood that while certain forms of this invention have been illustrated and described, it is not limited thereto except insofar as such limitations are included in the following claims and allowable functional equivalents thereof.

What is claimed is:

1. A method for detecting a high-altitude electromagnetic pulse (HEMP) at a monitored infrastructure, isolating an effect of the HEMP, and communicating detection information to the monitored infrastructure so as to protect the monitored infrastructure, said method for monitoring, detecting, isolating, and communicating, comprising:
    a phase unit receiving sensor signals from a plurality of sensors electrically connected individually to each of first phase, second phase, and third phase electrical lines, respectively, upstream of and associated with the monitored infrastructure, said plurality of sensors generating amplitude versus time data;
    determining in real time if said received sensor signals associated with said respective electrical line is indicative of an E1 component of a HEMP and, if so, actuating an isolation subsystem in less than 300 nanoseconds to electrically isolate said respective electrical line against propagation of hazardous electrical signals to the monitored infrastructure and, if not, continuing to monitor said received sensor signals;
    wherein said determining in real time if said received sensor signals associated with said respective electrical line is indicative of the E1 component of the HEMP includes a field programmable gate array (FPGA) having algorithms implemented via hardware that are operable to provide instantaneous detection and classification.

2. The method for detecting and isolating as in claim 1, wherein said determining in real time if said received sensor signals associated with said respective electrical line is indicative of the E1 component of the HEMP includes instantaneous evaluation of said amplitude versus time data.

3. The method for detecting and isolating as in claim 1, further comprising receiving signals from a 3D-vector sensor associated with the monitored infrastructure for capturing parameters of an electromagnetic field in time and frequency domains proximate the plurality of sensors and positioned in three mutually orthogonal axes to form said 3D-vector sensor.

4. The method for detecting and isolating as in claim 1, wherein said determining in real time if said received sensor signals associated with said respective electrical line is indicative of the E1 component of the HEMP includes providing a neural network (NN) having algorithms implemented via hardware configured for machine learning (ML) and artificial intelligence (AI) operable to provide instantaneous detection and classification of said sensor signals.

5. The method for detecting and isolating as in claim 3, wherein said ML/AI algorithms are trained using standard test waveforms and recorded historical data indicative of E1, E2, and E3 EMP signals.

6. The method for detecting and isolating as in claim 3, wherein said ML/AI algorithms are trained using hard-coded waveforms operable for:
    determining in real time an electric field rise time(s), magnitude peak value (V), slew rate (V/s), time duration above a threshold level(s), induced current (A), 3D-vector magnitude and direction parameters, ground reflected electromagnetic field, and Geo-location data;
    determining EMP frequency bandwidth, intensity at sub bands, maximal frequency above specified threshold spectral power density;
    determining EMP time and frequency domain transient characteristics indicative of the E1 component of the HEMP with signatures of intentional electromagnetic interference associated with high-power microwave and jamming sources.

7. The method for detecting and isolating as in claim 4, wherein said ML/AI algorithms include a voting mechanism operable to strengthen a determination that said evaluated electrical signals are indicative of the E1 component of the HEMP pulse.

8. The method for detecting and isolating as in claim 5, wherein said ML/AI algorithms include means for pattern recognition and classification using data with an inherited degree of variability in time and frequency domains evaluated per single or multiple axes as time series or spectral distribution series.

9. The method for detecting and isolating as in claim 1, further comprising communicating said sensor signals to a Local Control and Communication (LCC) module via a fiber optic link;
    wherein said LCC includes means for determining in real time if said received sensor signals associated with said respective electrical line is indicative of an E1 component of an EMP and, if so, actuating an isolation subsystem in less than 300 nanoseconds to electrically isolate said respective electrical line against electrical communication with the monitored infrastructure and, if not, continuing to monitor said received sensor signals.

10. The method for detecting and isolating as in claim 1, wherein said determining in real time if said received sensor signal data associated with said respective electrical line is indicative of an E1 component of an EMP includes evaluating said sensor signal data within a rise time of the HEMP.

11. A method for detecting and isolating a high-altitude electromagnetic pulse ("HEMP") along first phase, second phase, and third phase electrical lines electrically connected to a monitored infrastructure so as to protect the monitored infrastructure, said method for detecting and isolating comprising:
    a phase unit receiving sensor signals from a plurality of sensors electrically connected individually to each of the first phase, second phase, and third phase electrical lines, respectively, upstream of and associated with the monitored infrastructure, said plurality of sensors generating amplitude versus time data; and
    persistently monitoring the sensor signals for determining in real time if said received sensor signals associated with said respective electrical line is indicative of an E1 component of the HEMP and, if so, actuating an isolation subsystem in less than 300 nanoseconds to electrically isolate said respective electrical line against propagation of hazardous electrical signals to the monitored infrastructure and, if not, continuing to monitor said received sensor signals;

wherein said determining in real time if said received sensor signals associated with said respective electrical line is indicative of the E1 component of the HEMP includes a neural network (NN) implemented via hardware and having algorithms configured for machine learning (ML) and artificial intelligence (AI) operable to provide instantaneous detection and classification with a high level of confidence based on cooperative consensus classification.

12. The method for detecting and isolating as in claim 11, wherein said ML/AI algorithms are trained using models based on waveforms and recorded historical data indicative of E1, E2, and E3 phases of an electromagnetic pulse event.

13. The method for detecting and isolating as in claim 11, wherein said ML/AI algorithms include a voting mechanism operable to strengthen a determination that said evaluated sensor signals are indicative of the E1 component of the HEMP.

14. The method for detecting and isolating as in claim 11, wherein said determining in real time if said received sensor signals associated with said respective electrical line is indicative of the E1 component of the EMP includes a field programmable gate array (FPGA) having algorithms implemented via hardware that are operable to provide instantaneous detection and classification.

15. The method for detecting and isolating as in claim 11, further comprising communicating said sensor signals to a Local Control and Communication (LCC) module via a fiber optic link;

wherein said LCC includes means for determining in real time if said received sensor signals associated with said respective electrical line is indicative of an E1 component of the HEMP and, if so, actuating an isolation subsystem in less than 300 nanoseconds to electrically isolate said respective electrical line against propagation of hazardous electrical signals to the monitored infrastructure and, if not, continuing to monitor said received sensor signals.

16. The method for detecting and isolating as in claim 1, further comprising:

communicating said sensor signals to a Local Control and Communication (LCC) module and a Remote Control and Communication (RCC) module via fiber optic links;

wherein said LCC includes means for determining in real time if said received sensor signals associated with said respective electrical line is indicative of an E1 HEMP component and, if so, actuating said isolation subsystem in less than 300 nanoseconds to electrically isolate said respective electrical line against propagation of hazardous electrical signals to the monitored infrastructure and, if not, continuing to monitor said received sensor signals;

wherein said RCC includes means for determining in real time if said received sensor signals associated with said respective electrical line is indicative of an E1 HEMP component and, if so, actuating said isolation subsystem in less than 300 nanoseconds to electrically isolate said respective electrical line against electrical communication with the monitored infrastructure and, if not, continuing to monitor said received sensor signals.

17. The method for detecting and isolating as in claim 16 wherein said LCC and said RCC include means for wireless communication using transceivers and radio links in a 3 MHz to 30 MHz frequency range;

wherein said LCC and said RCC include means to sustain a state of disconnected antennas for self-protection from EMP effects and means to exit an antenna isolation mode after a specified time delay;

wherein said RCC includes means for optical and/or wireless communication with multiple LCCs.

18. The method for detecting and isolating as in claim 17, wherein said RCC includes an Electronic Control Module (ECM) operable to process data received from said multiple LCC modules and to algorithmically determine at least a direction and proximity of a source location.

19. The method for detecting and isolating as in claim 18, wherein said LCC is configured to transmit data to said RCC that is classified as an E1 HEMP event and data that is not classified as an E1 HEMP event.

20. The method for detecting and isolating as in claim 14 wherein said hardware operable to provide instantaneous detection and classification includes an integrated circuit (IC) using shell logic, a field programmable gate array (FPGA), or an embedded FPGA with custom blocks.

* * * * *